US011742292B2

(12) United States Patent
Van Dal et al.

(10) Patent No.: US 11,742,292 B2
(45) Date of Patent: Aug. 29, 2023

(54) INTEGRATED CHIP HAVING A BURIED POWER RAIL

(71) Applicant: Taiwan Semiconductor Manufacturing Co., Ltd., Hsinchu (TW)

(72) Inventors: Marcus Johannes Henricus Van Dal, Linden (BE); Gerben Doornbos, Kessel-Lo (BE)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 177 days.

(21) Appl. No.: 17/161,789

(22) Filed: Jan. 29, 2021

(65) Prior Publication Data

US 2022/0077062 A1   Mar. 10, 2022

Related U.S. Application Data

(60) Provisional application No. 63/075,994, filed on Sep. 9, 2020.

(51) Int. Cl.
*H01L 23/485* (2006.01)
*H01L 23/528* (2006.01)
(Continued)

(52) U.S. Cl.
CPC .......... *H01L 23/535* (2013.01); *H01L 21/743* (2013.01); *H01L 23/481* (2013.01);
(Continued)

(58) Field of Classification Search
CPC ... H01L 23/535; H01L 21/743; H01L 23/481; H01L 27/088; H01L 27/1203; H01L 29/4175; H01L 29/66742; H01L 23/4825; H01L 23/485; H01L 23/5286; H01L 29/41766; H01L 21/823807; H01L 21/76898; H01L 21/823871;
(Continued)

(56) References Cited

U.S. PATENT DOCUMENTS 6,583,045 B1 * 6/2003 Liu .................. H01L 23/535
257/276
2018/0145030 A1   5/2018 Beyne et al.
(Continued)

OTHER PUBLICATIONS

U.S. Appl. No. 16/587,671, filed Sep. 30, 2019.
U.S. Appl. No. 17/196,623, filed Mar. 9, 2021.

*Primary Examiner* — Herve-Louis Y Assouman
(74) *Attorney, Agent, or Firm* — Eschweiler & Potashnik, LLC

(57) ABSTRACT

The present disclosure relates to an integrated chip including a semiconductor device. The semiconductor device includes a gate structure overlying a front-side surface of a first substrate. The first substrate has a back-side surface opposite the front-side surface. A first source/drain structure overlies the first substrate and is laterally adjacent to the grate structure. A power rail is embedded in the first substrate and directly underlies the first source/drain structure. A first source/drain contact continuously extends from the first source/drain structure to the power rail. The first source/drain contact electrically couples the first source/drain structure to the power rail.

20 Claims, 30 Drawing Sheets

(51) Int. Cl.
*H01L 29/417* (2006.01)
*H01L 21/8238* (2006.01)
*H01L 21/768* (2006.01)
*H01L 29/06* (2006.01)
*H01L 29/423* (2006.01)
*H01L 29/66* (2006.01)
*H01L 29/775* (2006.01)
*H01L 29/786* (2006.01)
*H01L 27/092* (2006.01)
*H01L 23/535* (2006.01)
*H01L 21/74* (2006.01)
*H01L 23/48* (2006.01)
*H01L 27/088* (2006.01)
*H01L 27/12* (2006.01)
*H01L 23/482* (2006.01)

(52) U.S. Cl.
CPC ........ *H01L 27/088* (2013.01); *H01L 27/1203* (2013.01); *H01L 29/4175* (2013.01); *H01L 29/66742* (2013.01); *H01L 23/485* (2013.01); *H01L 23/4825* (2013.01)

(58) Field of Classification Search
CPC ........... H01L 29/0673; H01L 29/42392; H01L 29/66439; H01L 29/775; H01L 29/78696; H01L 27/092; H01L 21/76838; H01L 27/0924; H01L 29/0665; H01L 29/785; B82Y 10/00
See application file for complete search history.

(56) References Cited

U.S. PATENT DOCUMENTS

2020/0126987 A1* 4/2020 Rubin ................ H01L 29/0847
2020/0373301 A1* 11/2020 Kim .................... H01L 23/5286
2020/0373331 A1* 11/2020 Kim ..................... H01L 23/535

* cited by examiner

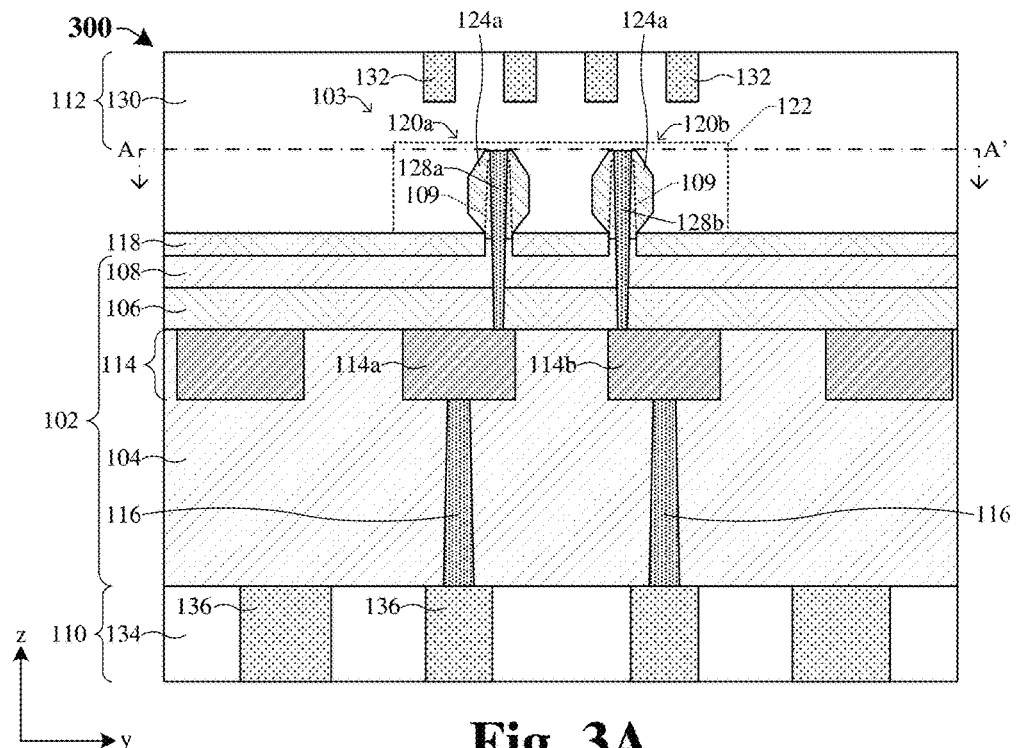
Fig. 3A
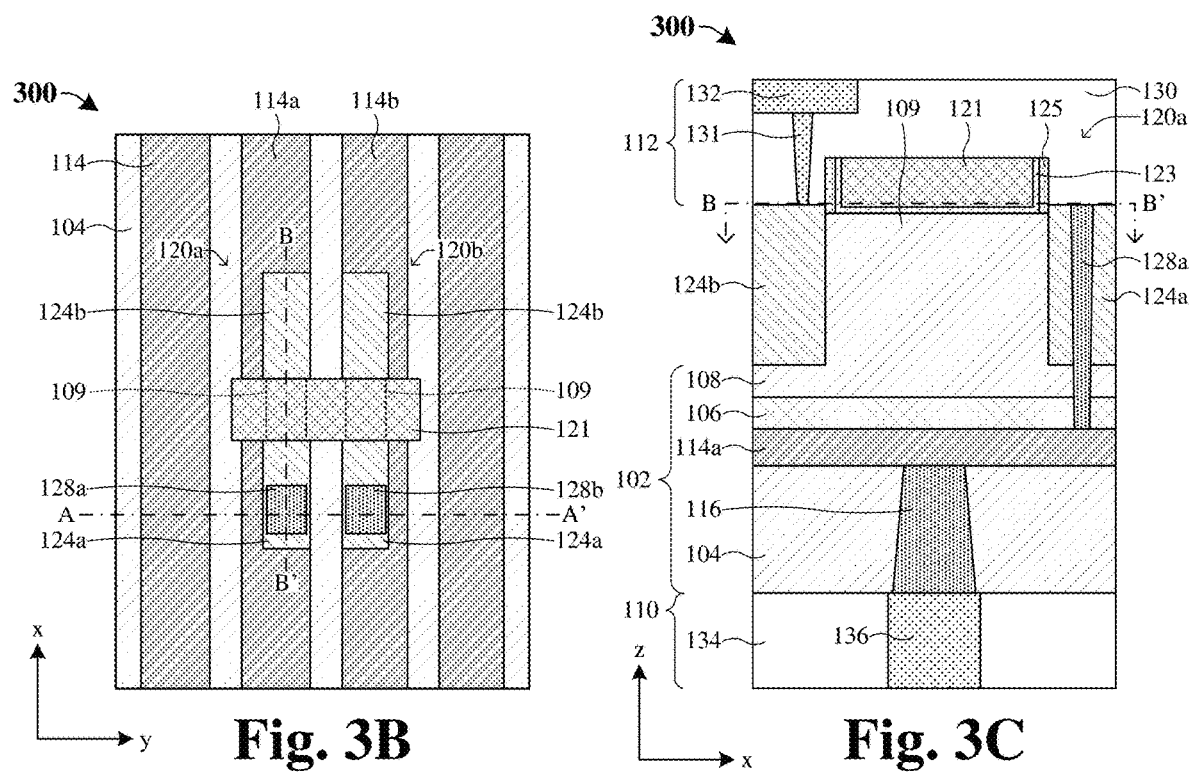
Fig. 3B
Fig. 3C

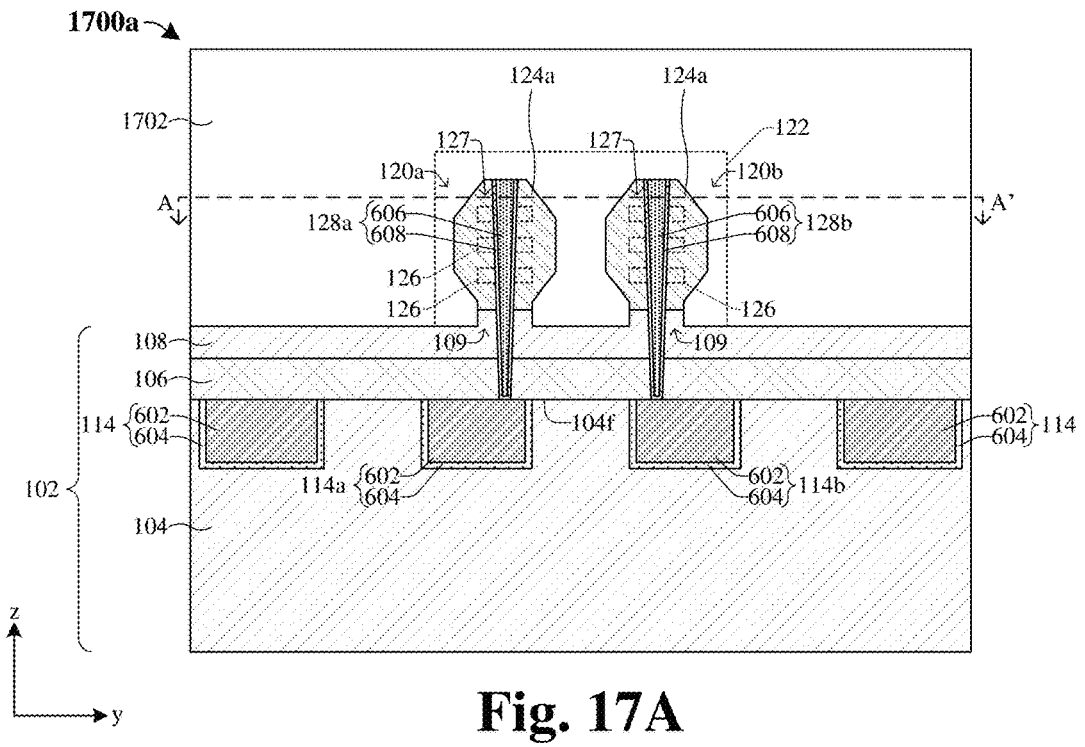
Fig. 17A
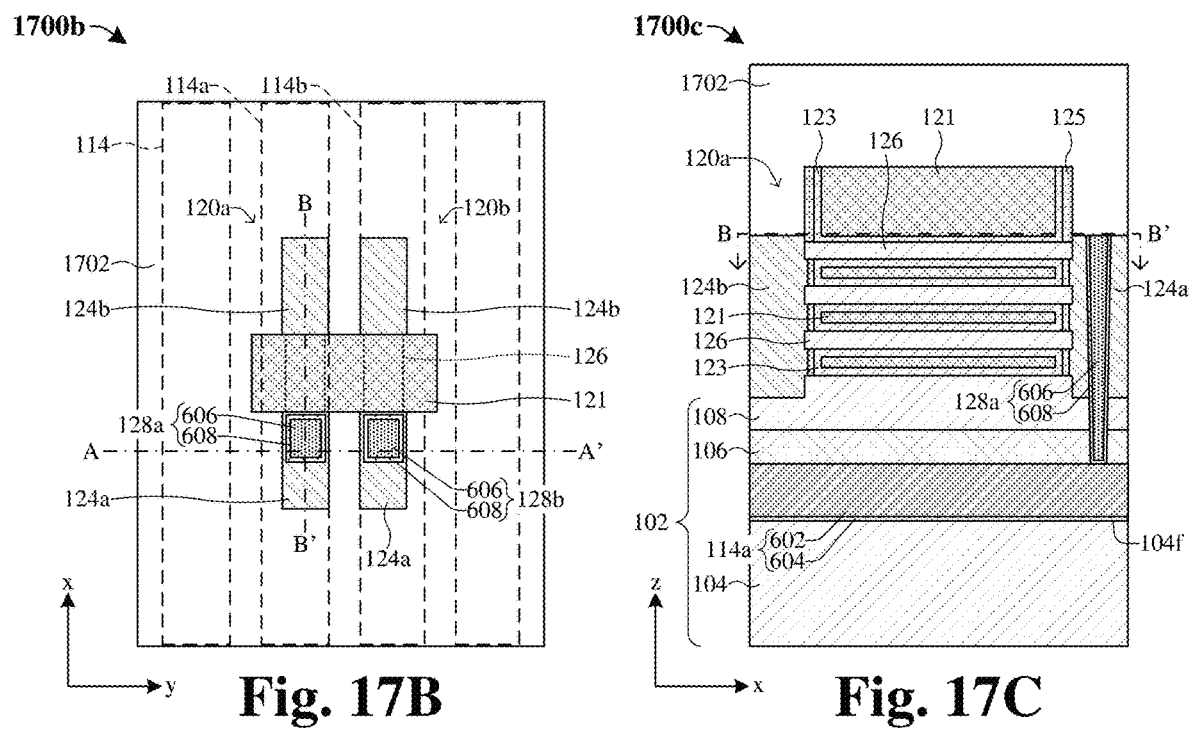
Fig. 17B
Fig. 17C

INTEGRATED CHIP HAVING A BURIED POWER RAIL

REFERENCE TO RELATED APPLICATION

This application claims the benefit of U.S. Provisional Application No. 63/075,994, filed on Sep. 9, 2020, the contents of which are hereby incorporated by reference in their entirety.

BACKGROUND

Modern day integrated chips contain millions of semiconductor devices. The semiconductor devices are electrically interconnected by way of metal interconnect layers that are formed above and/or below the devices on an integrated chip. A typical integrated chip comprises a plurality of metal interconnect layers including different sized metal wires vertically coupled together with metal vias.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3C illustrate various views of some embodiments of an IC comprising a plurality of buried power rails directly underlying a plurality of FETs and a plurality of source/drain contacts continuously extending from the FETs to the buried power rails.

FIGS. 9-21 illustrate various views of some embodiments of a method for forming an IC comprising a plurality of source/drain contacts continuously extending from a plurality of buried power rails to a plurality of FETs.

DETAILED DESCRIPTION

Figure 1A:
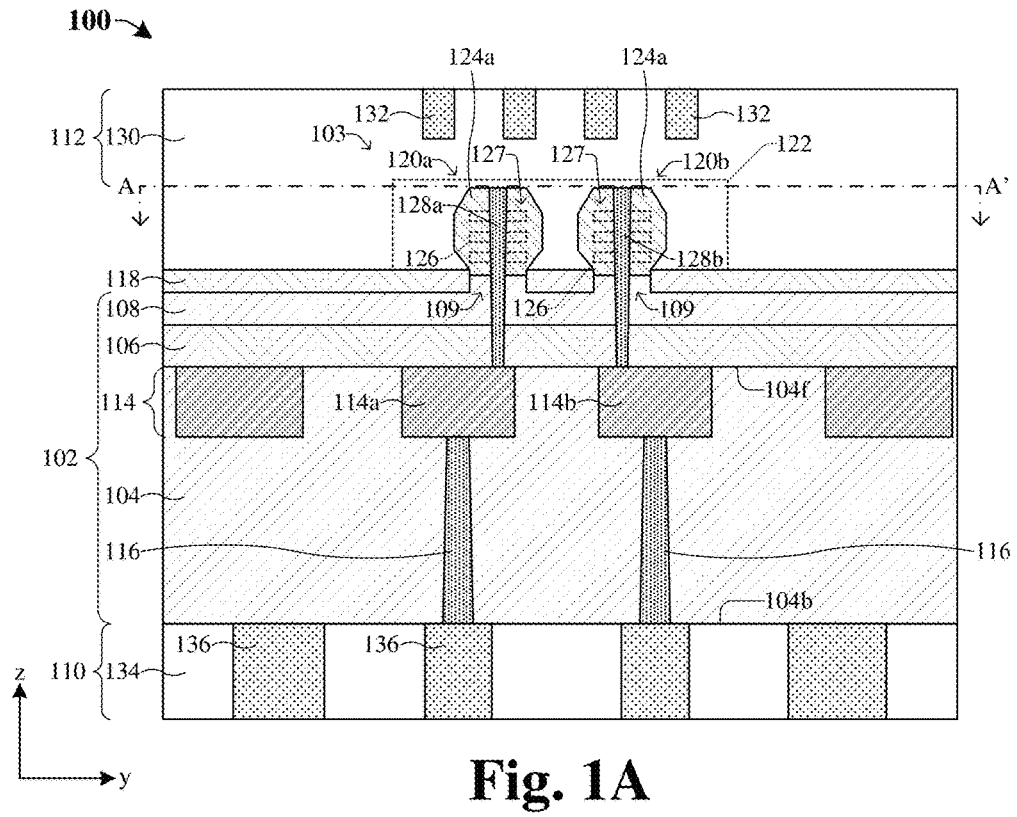
FIGS. 1A-1C illustrate various views of some embodiments of an integrated chip (IC) comprising a plurality of buried power rails directly underlying a plurality of field-effect transistors (FETs) and a plurality of source/drain contacts continuously extending from the FETs to the buried power rails.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

An integrated chip (IC) may comprise a semiconductor device (e.g., logic gate, inverter, latch, static random-access memory (SRAM), dynamic random-access memory (DRAM), etc.). The semiconductor device comprises a plurality of field-effect transistors (FETs) disposed on a front-side surface of a semiconductor substrate. The FETs each comprise a channel structure extending between a first source/drain structure and a second source/drain structure, and a gate electrode overlying and/or surrounding the channel structure. The plurality of FETs comprises n-channel FETs and p-channel FETs. An upper interconnect structure overlies the front-side surface of the substrate and comprises a plurality of conductive vias and a plurality of conductive wires. The conductive vias and conductive wires are configured to electrically couple the n-channel FETs and the p-channel FETs together in a predefined manner to form the semiconductor device. In some embodiments, the FETs of the semiconductor device may be fin field-effect transistor (finFETs), gate-all-around FETs (GAAFETs), etc. A first layer of the plurality of conductive wires overlying the n-channel FETs and the p-channel FETs may be configured to deliver control signals and/or power to the semiconductor device.

One challenge with the above semiconductor device is scaling down device features in order to increase device density without degrading device performance. For example, at least four signal conductive wires and two power conductive wires (e.g., referred to as power rails) may be disposed in the first layer of conductive wires overlying the semiconductor device. The signal conductive wires are configured to deliver control signals to the semiconductor device and the power conductive wires are configured to supply high power to the semiconductor device. A width of each power conductive wires is at least double a width of an individual signal conductive wire to ensure the power conductive wires can facilitate the delivery of high power to the semiconductor device. As the device features are scaled down, a spacing between adjacent conductive wires in the first layer of conductive wires may be decreased and/or a width of each conductive wire may be decreased. Decreasing the spacing between adjacent conductive wires may increase capacitance between the adjacent conductive wires, thereby increasing a resistance-capacitance (RC) delay of the semiconductor device. Decreasing the width of each power conductive wires may decrease an ability for the power conductive wires to stably deliver high power to the semiconductor device, thereby decreasing a performance and/or endurance of the semiconductor device.

One partial solution to facilitate scaling down of device features is to embed power rails within the semiconductor substrate, thereby decreasing the number of conductive wires disposed within the first layer of conductive wires of the upper interconnect structure (i.e., omitting the power conductive wires from the first layer of conductive wires). In such a partial solution, a lower interconnect structure is disposed along a back-side surface of the semiconductor substrate to supply power to the embedded power rails. Further, a plurality of through substrate vias (TSVs) extend through the semiconductor substrate to electrically couple the embedded power rails to the lower interconnect structure. Upper conductive wires and vias within the upper interconnect structure overlie the embedded power rails to electrically couple the embedded power rails to the source/drain structures of the n-channel FETs and the p-channel FETs. However, such a partial solution decreases the number of FETs that may be disposed on the front-side surface of the semiconductor structure because the embedded power rails are disposed in the front-side surface and are laterally adjacent to the FETs, thereby decreasing device density. Further, the upper conductive wires and vias increase a design complexity of the semiconductor device and increases the number of conductive structures disposed within the upper interconnect structure. In addition, the embedded power rails have a high aspect ratio (e.g., the embedded power rails have a length larger than a corresponding width) to facilitate the embedded power rails being adjacent to the FETs. The high aspect ratio results in unacceptable processing challenges (e.g., difficulties in accurately aligning the TSVs with the embedded power rails).

Various embodiments of the present application are directed toward an integrated chip (IC) comprising a semiconductor device (e.g., an inverter) with increased device density. The semiconductor device comprises a plurality of FETs disposed on a semiconductor substrate. The plurality of FETs may, for example, include a first GAAFET and a second GAAFET laterally adjacent to one another. The first and second GAAFETs respectively comprise a first source/drain structure and a second source/drain structure disposed over the semiconductor substrate and a plurality of nanostructures (i.e., referred to as a channel structure) extending between the first and second source/drain structures. A gate structure overlies the semiconductor substrate and continuously extends from the first GAAFET to the second GAAFET. An upper interconnect structure overlies the semiconductor substrate and comprises conductive wires and conductive vias directly electrically coupled to the gate structure. A plurality of power rails is disposed within the semiconductor substrate and is vertically separated from the first and second GAAFETs by an isolation structure. The plurality of power rails comprises a first power rail directly underlying a first source/drain structure of the first GAAFET and a second power rail directly underlying a first source/drain structure of the second GAAFET. A lower interconnect structure underlies the semiconductor substrate and a plurality of TSVs extends from the lower interconnect structure, through the semiconductor substrate, to the plurality of power rails. Further, a first source/drain contact extends from the first source/drain structure of the first GAAFET to the first power rail and a second source/drain contact extends from the first source/drain structure of the second GAAFET to the second power rail. The first and second source/drain contacts are configured to electrically couple the first and second GAAFETs to the first and second power rails.

By disposing the plurality of power rails within the semiconductor substrate and directly under the first and second GAAFETs a number of FETs disposed on the semiconductor substrate may be increased, thereby increasing a device density of the IC. Further, by disposing the first and second source/drain contacts between the first and second GAAFETs and the plurality of power rails, a number of conductive wires and vias disposed within the upper interconnect structure may be reduced. This, in part, facilitates scaling down device features of the IC, thereby further increasing the device density of the IC.

Figure 1B:
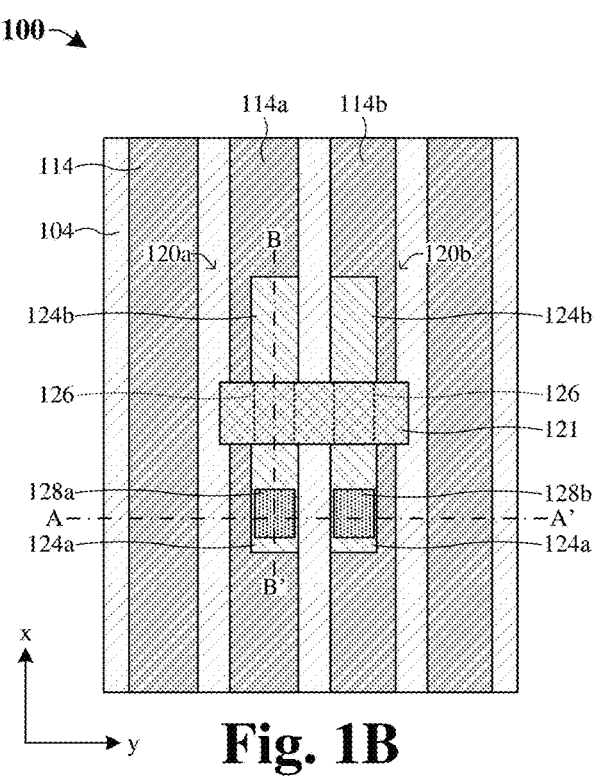
Figure 1C:
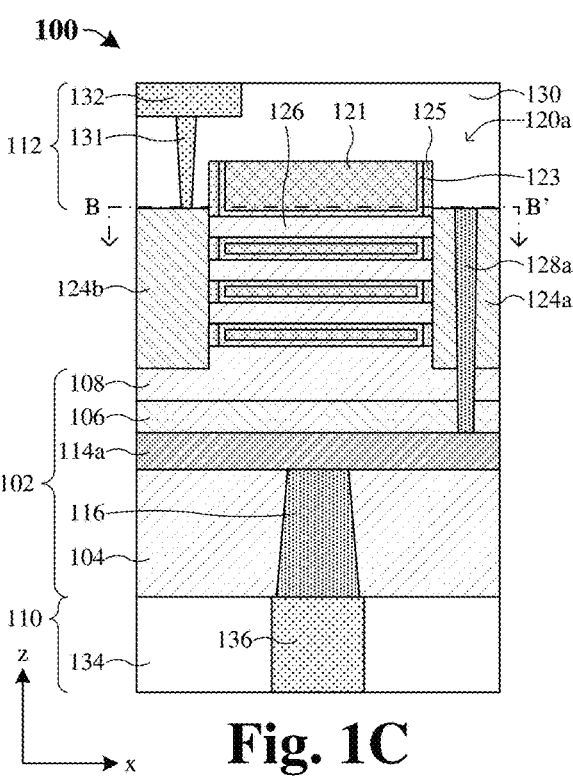

FIGS. 1A-1C illustrate various views of some embodiments of an integrated chip (IC) 100 comprising a plurality of buried power rails directly underlying a plurality of field-effect transistors (FETs) and a plurality of source/drain contacts continuously extending from the buried power rails to the FETs. FIG. 1A illustrates a cross-sectional view of some embodiments of the IC 100; FIG. 1B illustrates a top view of some embodiments of the IC 100; and FIG. 1C illustrates another cross-sectional view of some embodiments of the IC 100. In various embodiments, the cross-sectional view of FIG. 1A may be taken along the line A-A' of FIG. 1B, and the cross-sectional view of FIG. 1C may be taken along the line B-B' of FIG. 1B. In yet further embodiments, various features of FIGS. 1A and 1C may be removed (e.g., the lower insulating structure 106, the second substrate 108, the upper insulating structure 118, the first interconnect dielectric structure 130, the gate dielectric layer 123, the inner spacers 125, etc.) from the top view of FIG. 1B.

The IC 100 comprises a semiconductor device 103 having a plurality of FETs 120a-b. The semiconductor device 103 is disposed on a semiconductor substrate 102. In various embodiments, the semiconductor substrate 102 may comprise any type of semiconductor body (e.g., monocrystalline silicon/CMOS bulk, silicon-germanium (SiG), etc.) and/or may be configured has a silicon-on-insulator (SOI) substrate. In various embodiments, the semiconductor substrate 102 comprises a first substrate 104, a lower insulating structure 106, and a second substrate 108. The lower insulating structure 106 is disposed between the first substrate 104 and the second substrate 108. In various embodiments, the lower insulating structure 106 is configured to electrically isolate devices and/or structures disposed within/on the first substrate 104 from devices and/or structures disposed within/on the second substrate 108. In some embodiments, the first substrate 104 may be referred to as a handle substrate and the second substrate 108 may be referred to as a device layer. The first substrate 104 has a front-side surface 104f opposite a back-side surface 104b.

A plurality of fins 109 project vertically (in the "z" direction) from the second substrate 108 and extend laterally (in the "x" direction) across the second substrate 108. The fins 109 may extend in parallel with one another (in the "x" direction). The fins 109 may, for example, be or comprise silicon, germanium, silicon-germanium, some other semiconductor material, or any combination of the foregoing. In various embodiments, the fins 109 may be referred to as semiconductor fins. Further, an upper insulating structure 118 is disposed over the second substrate 108 and between adjacent fins in the plurality of fins 109. The upper insulating structure 118 is configured to electrically isolate adjacent fins in the plurality of fins 109 from one another. In some embodiments, the upper insulating structure 118 may, for example, be or comprise silicon dioxide, silicon nitride, silicon carbide, silicon oxynitride, silicon oxycarbide, some other dielectric material, or any combination of the foregoing. In yet further embodiments, the upper insulating structure 118 may be configured as a shallow trench isolation (STI) structure or some other suitable isolation structure. The fins 109 extend vertically (in the "z" direction) through the upper isolation structure 118. In some embodiments, upper surfaces of the fins 109 are substantially co-planar. In various embodiments, the upper surfaces of the fins 109 are disposed below (or above) an upper surface of the upper insulating structure 118.

In various embodiments, the plurality of FETs 120a-b include a first FET 120a and a second FET 120b disposed on/over the semiconductor substrate 102. In further embodiments, the first and second FETs 120a, 120b respectively comprise a pair of source/drain structures 124a-b, a nanostructure stack 127, and a portion of a gate structure 122. The nanostructure stacks 127 each overlie a corresponding fin in the plurality of fins 109. For example, the nanostructure stack 127 of the first FET 120a overlies a first fin in the plurality of fins 109 and the nanostructure stack 127 of the second FET 120b overlie a second fin in the plurality of fins 109. The nanostructure stacks 127 respectively comprises a plurality of nanostructures 126 that are vertically stacked over one another (in the "z" direction). In various embodiments, the plurality of nanostructures 126 is vertically spaced (in the "z" direction) from the plurality of fins 109. In further embodiments, nanostructures of the plurality of nanostructures 126 are spaced from one another (in the "z" direction). In yet further embodiments, the plurality of nanostructures 126 comprises between two and twenty nanostructures, or any number of nanostructures. The plurality of nanostructures 126 may, for example, be or comprise silicon, germanium, silicon germanium, some other semiconductor material, or any combination of the foregoing. In yet further embodiments, the nanostructures of the plurality of nanostructures 126 may be referred to as semiconductor nanostructures.

The pair of source/drain structures 124a-b are disposed on/over the fins 109. The pair of source/drain structures 124a-b are spaced laterally (in the "x" direction) and disposed on opposite sides of the plurality of nanostructures 126. In various embodiments, the pair of source/drain structures 124a-b may, for example, be or comprise silicon, germanium, silicon germanium, silicon carbide, some other semiconductor material, or any combination of the foregoing. In further embodiments, the pair of source/drain structures 124a-b may be or comprise an epitaxial semiconductor material (e.g., a semiconductor material formed by an epitaxial process, such as epitaxial silicon, epitaxial germanium, epitaxial silicon germanium, epitaxial silicon carbide, etc.). Each pair of source/drain structures 124a-b may, for example, comprise a first source/drain structure 124a and a second source/drain structure 124b laterally separated from one another.

The gate structure 122 extends laterally (in the "y" direction) from the plurality of nanostructures 126 of the first FET 120a to the plurality of nanostructures 126 of the second FET 120b. The plurality of nanostructures 126 extend through the gate structure 122. Further, the gate structure 122 comprises a gate dielectric layer 123 and a gate electrode 121. The gate dielectric layer 123 lines the plurality of nanostructures 126 and separates the nanostructures 126 from the gate electrode 121. In addition, a plurality of inner spacers 125 laterally separate the gate structure 122 from the pair of source/drain structures 124a-b. A plurality of selectively conductive channels (not shown) are disposed within the plurality of nanostructures 126. The plurality of conductive channels extends laterally (in the "x" direction) between the pair of source/drain structures 124a-b. By applying suitable bias conditions to the gate electrode 121 and the pair of source/drain structures 124a-b, a conductivity of the selectively conductive channels may be controlled (e.g., switch between one or more conducting states and a non-conducting state).

A second interconnect structure 110 is disposed along a lower surface of the semiconductor substrate 102 and a first interconnect structure 112 overlies the semiconductor substrate 102. The second interconnect structure 110 comprises a second interconnect dielectric structure 134 and a plurality of second conductive wires 136 disposed within the second interconnect dielectric structure 134. The first interconnect structure 112 comprises a first interconnect dielectric structure 130, a plurality of first conductive wires 132, and a plurality of first conductive vias 131. A plurality of power rails 114 is disposed within the first substrate 104. The power rails 114 are electrically isolated from the plurality of FETs 120a-b by the lower insulating structure 106 and/or the upper insulating structure 118. The plurality of power rails 114 comprises a first power rail 114a directly underlying the first FET 120a and a second power rail 114b directly underlying the second FET 120b. Further, a plurality of through-substrate vias (TSVs) 116 is disposed within the first substrate 104 and continuously extends from the second interconnect structure 110 to the plurality of power rails 114. The TSVs are configured to electrically couple the power rails 114 to the second conductive wires 136 of the second interconnect structure 110. In various embodiments, the first interconnect dielectric structure 130 continuously extends along and contacts a top surface of the first source/drain structure 124a. For example, the first interconnect dielectric structure 130 continuously laterally extends along the top surface of the first source/drain structure 124a from a first outer sidewall of the first source/drain structure 124a to a second outer sidewall of the first source/drain structure 124a. In yet further embodiments, the first conductive vias 131 are laterally offset from the top surface of the first source/drain structure 124a by a non-zero distance.

In various embodiments, each of the plurality of FETs 120a-b are configured as gate-all-around field-effect transistors (GAAFETs). For example, the first FET 120a may be configured as a first GAAFET and the second FET 120b may be configured as a second GAAFET. In some embodiments, the first FET 120a is a n-channel GAAFET and the second FET 120b is a p-channel GAAFET. In such embodiments, the semiconductor device 103 may be configured as an inverter. In yet further embodiments, each of the plurality of FETs 120a-b may, for example, each be or comprise a metal oxide semiconductor field effect transistor (MOSFET), a high voltage transistor, a bipolar junction transistor (BJT), an n-channel metal oxide semiconductor (nMOS) transistor, a p-channel metal oxide semiconductor (pMOS) transistor, a finFET, a GAAFET, a gate-surrounding FET, a multi-bridge channel FET (MBCFET), a nanowire FET, a nanoring FET, a nanosheet field-effect transistor (NSFET), or the like. It will be appreciated that the plurality of FETs 120a-b each being configured as another device is also within the scope of the disclosure.

A plurality of source/drain contacts 128a-b continuously extend from the first source/drain structure 124a of the first and second FETs 120a, 120b to the first and second power rails 114*a-b*. The plurality of source/drain contacts 128*a-b* comprise a first source/drain contact 128*a* and a second source/drain contact 128*b*. The first source/drain contact 128*a* vertically extends through the first source/drain structure 124*a* of the first FET 120*a*, the second substrate 108, and the lower insulating structure 106 to the first power rail 114*a*. The second source/drain contact 128*b* vertically extends through the first source/drain structure 124*a* of the second FET 120*b*, the second substrate 108, and the lower insulating structure 106 to the second power rail 114*b*. Thus, the first and second source/drain contacts 128*a*, 128*b* are configured to electrically couple the first and second FETs 120*a*, 120*b* to the plurality of power rails 114.

In various embodiments, the power rails 114 are configured to supply power to the plurality of FETs 120*a-b*. By disposing the plurality of power rails 114 within the first substrate 104, a number of conductive structures (e.g., conductive wires and/or conductive vias) disposed within the first interconnect structure 112 may be decreased. This facilitates shrinking device features of the IC 100 thereby increasing a number of semiconductor devices that may be disposed within/on the semiconductor substrate 102. Further, by embedding the power rails 114 within the first substrate 104 and directly below the plurality of FETs 120*a-b*, a size of the power rails 114 may be increased. This, in part, decreases design complexity and facilitates accurately aligning/disposing the TSVs 116 on the power rails 114 during fabrication of the IC 100. In addition, by disposing the first and second source/drain contacts 128*a*, 128*b* between the first source/drain structure 124*a* of the first and second FETs 120*a*, 120*b* and the power rails 114, the number of conductive structures (e.g., conductive wires and/or conductive vias) disposed within the first interconnect structure 112 may be further decreased. This decreases a routing density over the top surface of the semiconductor substrate 102 and further facilitates shrinking device features of the IC 100.

Figure 2:
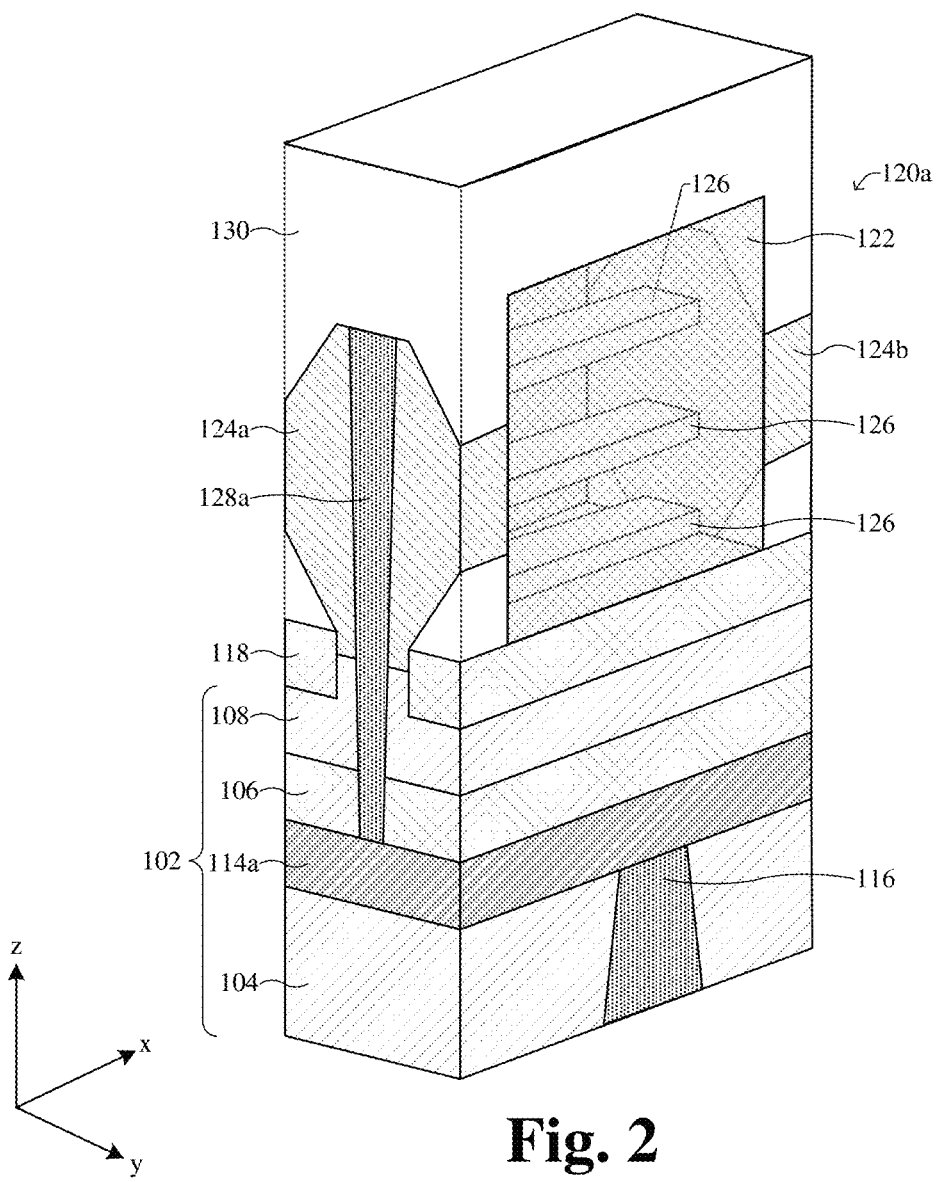
FIG. 2 illustrates an isometric view of some embodiments of a first FET of FIGS. 1A-1C.

FIG. 2 illustrates an isometric view of some embodiments of the first FET 120*a* of FIGS. 1A-1C. As illustrated in FIG. 2, the plurality of nanostructures 126 are disposed within the gate structure 122 and continuously laterally extend from the first source/drain structure 124*a* to the second source/drain structure 124*b*. In various embodiments, the first interconnect dielectric structure 130 continuously laterally extends along an upper surface of the first source/drain contact 128*a*. In yet further embodiments, the upper surface of the first source/drain contact 128*a* is aligned with a top surface of the first source/drain structure 124*a*. In some embodiments, a bottommost nanostructure in the plurality of nanostructures 126 is disposed along an upper surface of the upper insulating structure 118.

FIGS. 3A-3C illustrate various views of some embodiments of an IC 300 corresponding to some alternative embodiments of the IC 100 of FIGS. 1A-1C, in which the plurality of FETs 120*a-b* are each configured as a finFET. For example, the first FET 120*a* may be configured as a first finFET and the second FET 120*b* may be configured as a second finFET. In various embodiments, the first FET 120*a* is a n-channel finFET and the second FET 120*b* is a p-channel finFET. FIG. 3A illustrates a cross-sectional view of some embodiments of the IC 300; FIG. 3B illustrates a top view of some embodiments of the IC 300; and FIG. 3C illustrates another cross-sectional view of some embodiments of the IC 300. In various embodiments, the cross-sectional view of FIG. 3A may be taken along the line A-A' of FIG. 3B, and the cross-sectional view of FIG. 3C may be taken along the line B-B' of FIG. 3B. In yet further embodiments, various features of FIGS. 3A and 3C may be removed (e.g., the lower insulating structure 106, the second substrate 108, the upper insulating structure 118, the first interconnect dielectric structure 130, the gate dielectric layer 123, the inner spacers 125, etc.) from the top view of FIG. 3B.

In some embodiments, the first and second FETs 120*a*, 120*b* respectively comprise a fin 109 that projects vertically (in the "z" direction) from the second substrate 108 and extend laterally (in the "x" direction) across the second substrate 108. In various embodiments, the fins 109 extend in parallel with one another (in the "x" direction). In further embodiments, top surfaces of the fins 109 are disposed above a top surface of the upper insulating structure 118. A pair of source/drain structures 124*a-b* is disposed on opposite sides of each fin 109. A selectively conductive channel (not shown) is disposed within each fin 109 such that the selectively conductive channel extends laterally (in the "x" direction) between a corresponding pair of source/drain structures 124*a-b*. By applying suitable bias conditions to the gate electrode 121 and the pair of source/drain structures 124*a-b*, a conductivity of the selectively conductive channel may be controlled (e.g., switch between one or more conducting states and a non-conducting state).

The plurality of source/drain contacts 128*a-b* extend vertically (in the "z" direction) through the first source/drain structure 124*a* of the first and second FETs 120*a*, 120*b*, the second substrate 108, and the lower insulating structure 106 to the plurality of power rails 114. In various embodiments, top surfaces of the source/drain contacts 128*a-b* are disposed above top surfaces of the fins 109. In yet further embodiments, the fin 109 of the first FET 120*a* directly overlies the first power rail 114*a* and the fin 109 of the second FET 120*b* directly overlies the second power rail 114*b*. In various embodiments, the first source/drain contact 128*a* directly contacts the first source/drain structure 124*a* of the first FET 120*a* and directly contacts the first power rail 114*a*, and the second source/drain contact 128*b* directly contacts the first source/drain structure 124*a* of the second FET 120*b* and directly contacts the second power rail 114*b*.

Figure 4:
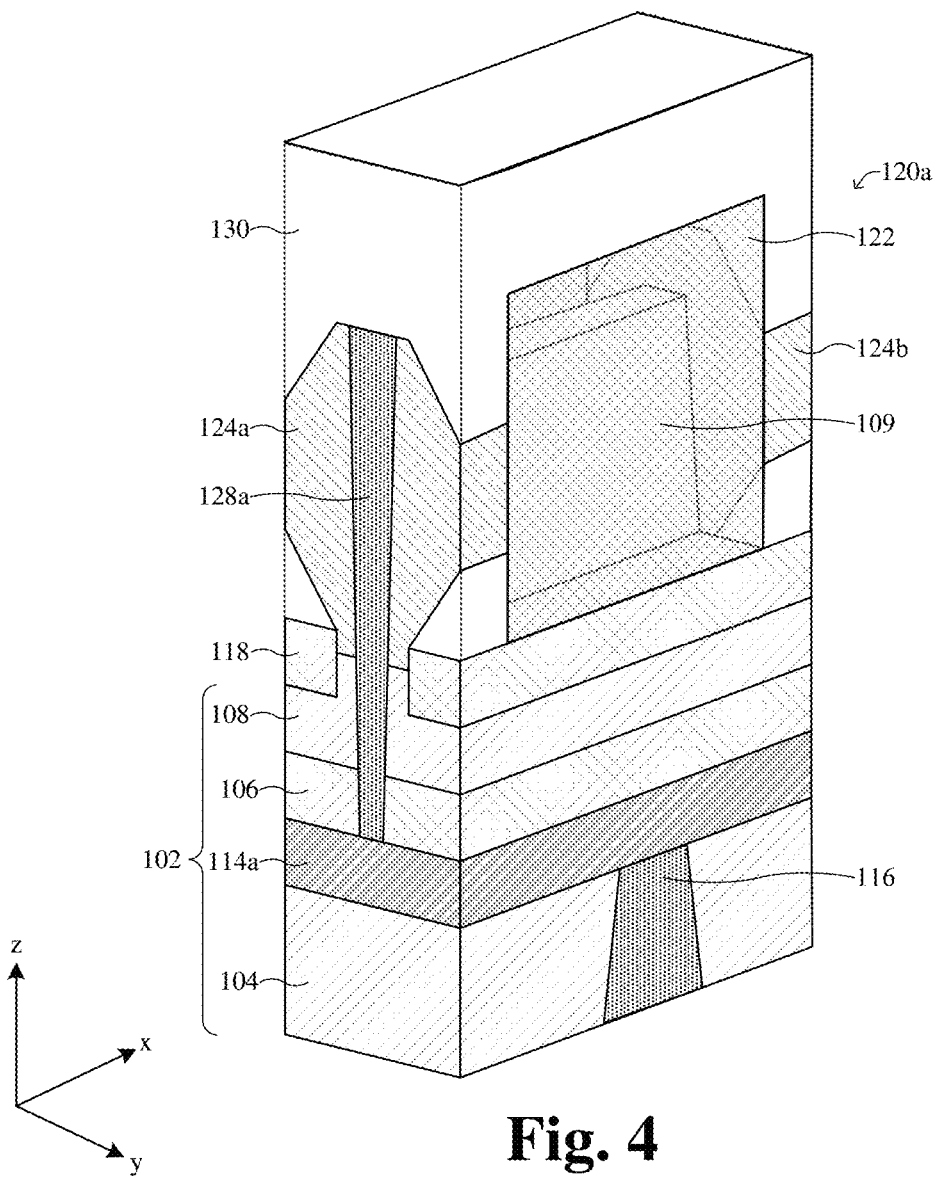
FIG. 4 illustrates an isometric view of some embodiments of a first FET of FIGS. 3A-3C.

FIG. 4 illustrates an isometric view of some embodiments of the first FET 120*a* of FIGS. 3A-3C. As illustrated in FIG. 4, the fin 109 is disposed within the gate structure 122 and continuously laterally extends from the first source/drain structure 124*a* to the second source/drain structure 124*b*. In various embodiments, the first interconnect dielectric structure 130 continuously laterally extends along the top surface of the first source/drain contact 128*a*. In yet further embodiments, the top surface of the first source/drain contact 128*a* is aligned with a top surface of the first source/drain structure 124*a*.

Figure 5A:
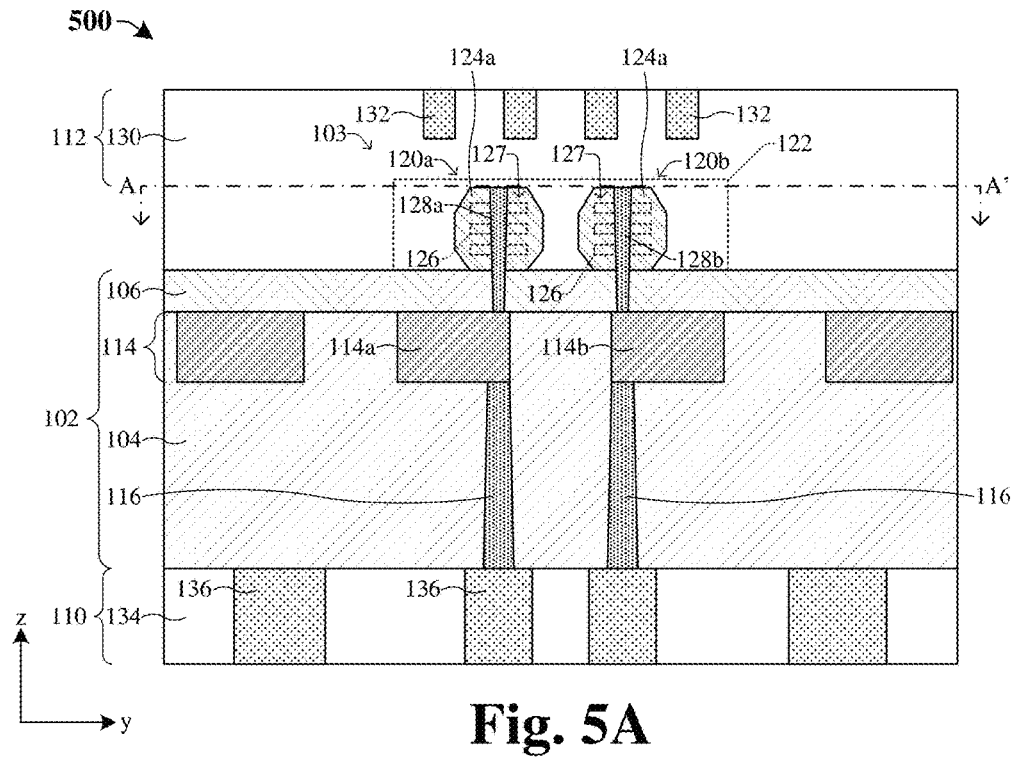
FIGS. 5A-5C illustrate various views of some alternative embodiments of the IC of FIGS. 1A-1C.
Figure 5B:
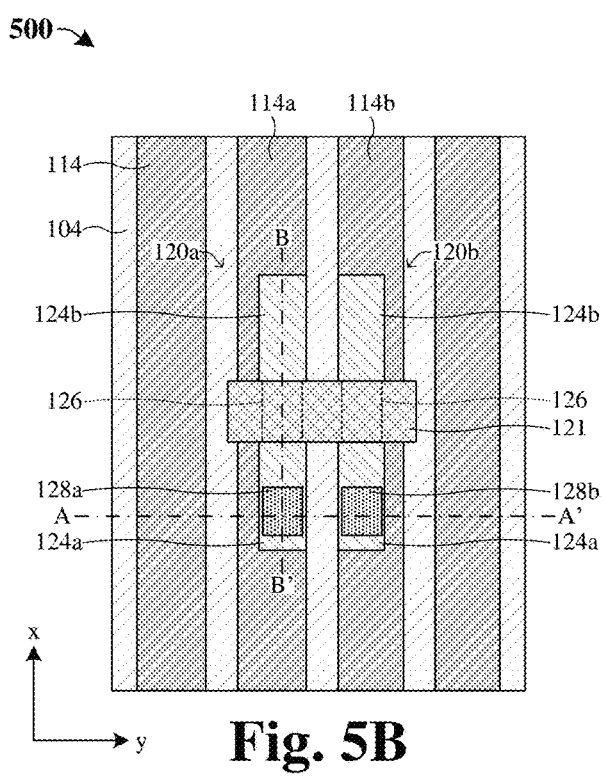
Figure 5C:
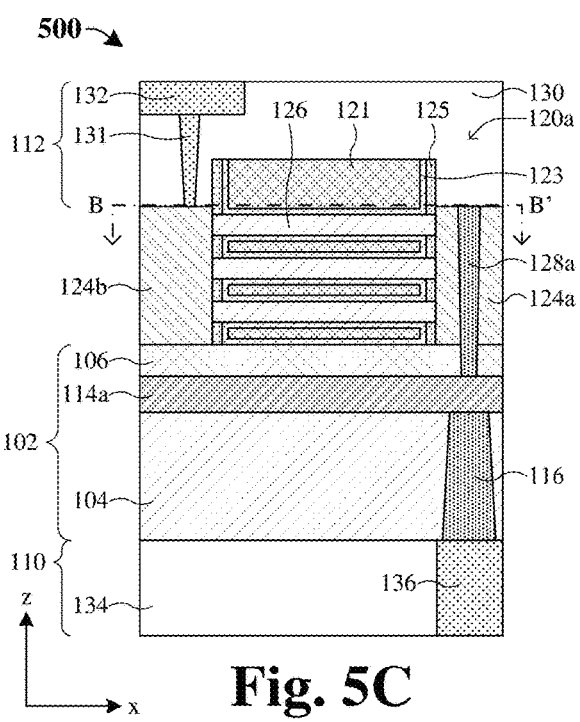

FIGS. 5A-5C illustrate various views of some embodiments of an IC 500 corresponding to some alternative embodiments of the IC 100 of FIGS. 1A-1C, in which the second substrate (108 of FIG. 1A) and the upper insulating structure (118 of FIG. 1A) are omitted. In some embodiments, the plurality of nanostructures 126 directly overlie the lower insulating structure 106. In further embodiments, the plurality of source/drain contacts 128*a-b* continuously vertically extend through a corresponding first source/drain structure of the FETs 120*a-b* and the lower insulating structure 106 to the plurality of power rails 114. In some embodiments, FIG. 5B illustrates a top view of some embodiments of the IC 500; FIG. 5A illustrates a cross-sectional view of some embodiments of the IC 500 taken along the line A-A' of FIG. 5B; and FIG. 5C illustrates another cross-sectional view of some embodiments of the IC 500 taken along the line B-B' of FIG. 5B. In yet further embodiments, various features of FIGS. 5A and 5C may be removed (e.g., the lower insulating structure 106, the second substrate 108, the upper insulating structure 118, the first interconnect dielectric structure 130, the gate dielectric layer 123, the inner spacers 125, etc.) from the top view of FIG. 5B.

Figure 6A:
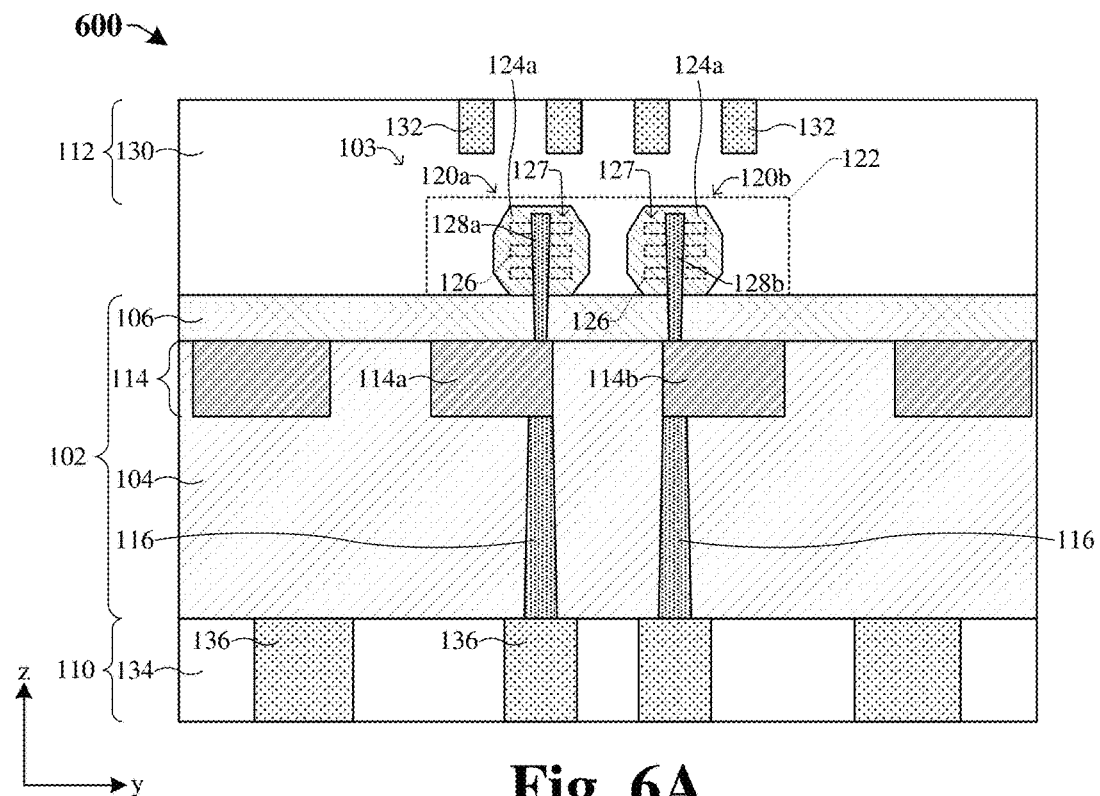
FIGS. 6A-6F illustrate cross-sectional views of some alternative embodiments of the IC of FIGS. 1A-1C.

FIG. 6A illustrates a cross-sectional view of some embodiments of an IC 600 corresponding to some alternative embodiments of the IC 100 of FIGS. 1A-1C, in which top surfaces of the first and second source/drain contacts 128a, 128b are respectively disposed vertically between the top surface of a corresponding first source/drain structure 124a and a top surface of a topmost nanostructure 126. For example, the top surface of the first source/drain contact 128a is disposed vertically between the top surface of the first source/drain structure 124a of the first FET 120a and a top surface of a topmost nanostructure 126 of the first FET 120a.

Figure 6B:
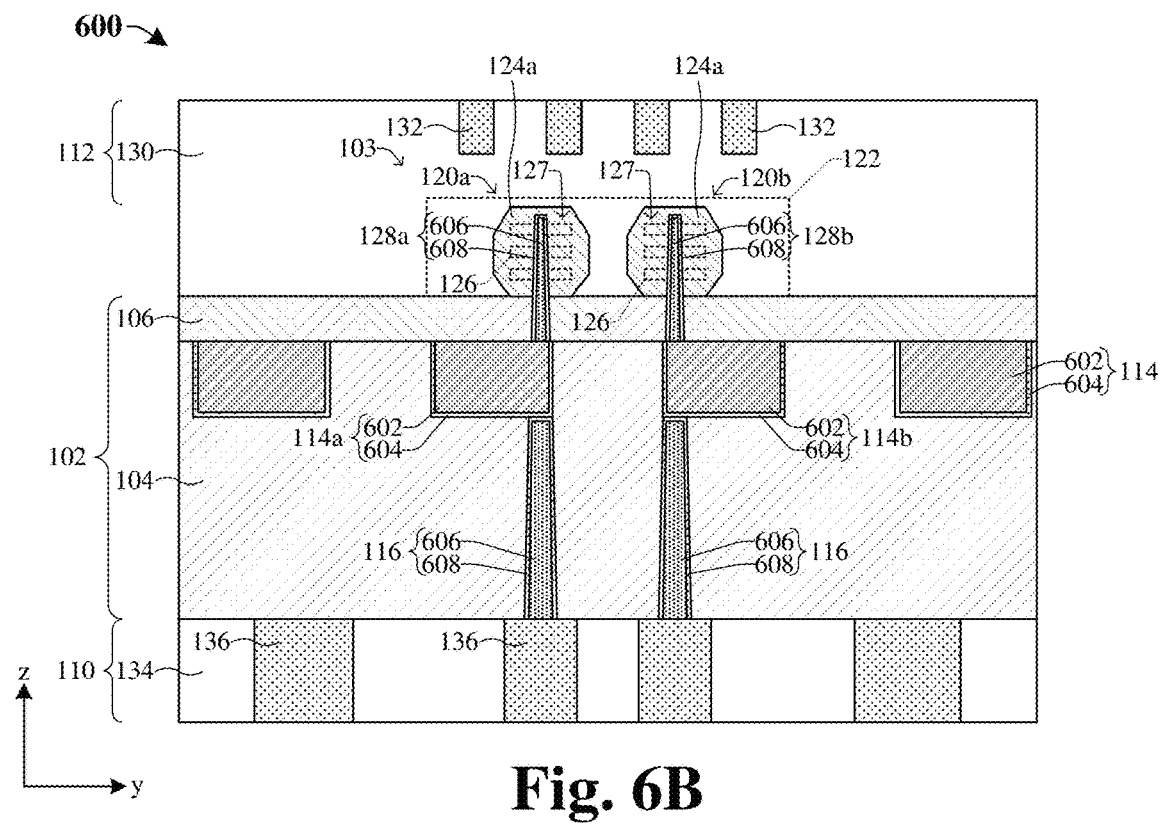

FIG. 6B illustrates a cross-sectional view of some alternative embodiments of the IC 600 of FIG. 6A, in which the power rails 114 respectively comprise a first conductive body 602 and a first conductive liner 604 that extends from opposing sidewalls of the first conductive body 602 to a lower surface of the first conductive body 602. In various embodiments, the first conductive body 602 may, for example, be or comprise tungsten, ruthenium, molybdenum, another conductive material, or any combination of the foregoing. In further embodiments, the first conductive liner 604 may, for example, be or comprise titanium nitride, tantalum nitride, another conductive material, or any combination of the foregoing. In yet further embodiments, the first conductive liner 604 may be configured as a diffusion barrier layer or an adhesion layer.

In further embodiments, the first and second source/drain contacts 128a, 128b and the TSVs 116 respectively comprise a second conductive body 606 and a second conductive liner 608 laterally enclosing the second conductive body 606. In various embodiments, the second conductive body 606 may, for example, be or comprise copper, aluminum, ruthenium, tungsten, another conductive material, or any combination of the foregoing. In further embodiments, the second conductive liner 608 may, for example, be or comprise titanium, tantalum, titanium nitride, tantalum nitride, another conductive material, or any combination of the foregoing.

Figure 6C:
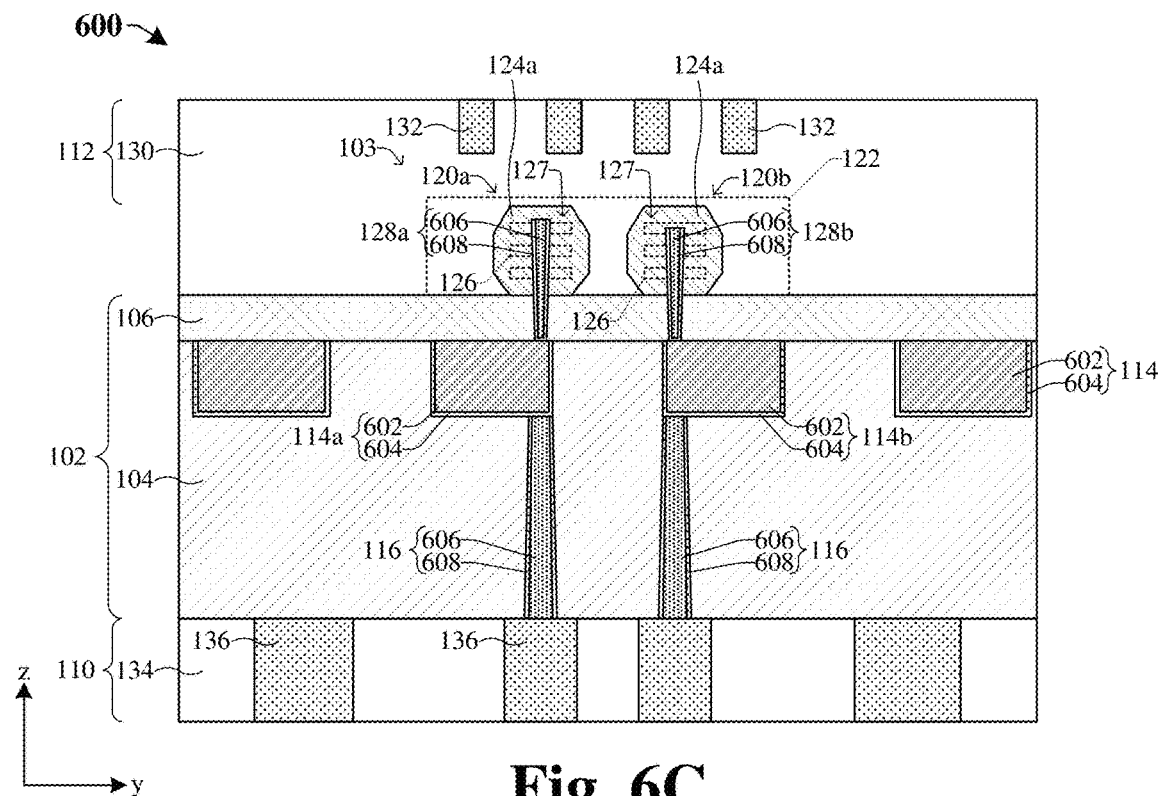

FIG. 6C illustrates a cross-sectional view of some alternative embodiments of the IC 600 of FIG. 6A, in which a height of the first source/drain contact 128a is greater than a height of the second source/drain contact 128b.

Figure 6D:
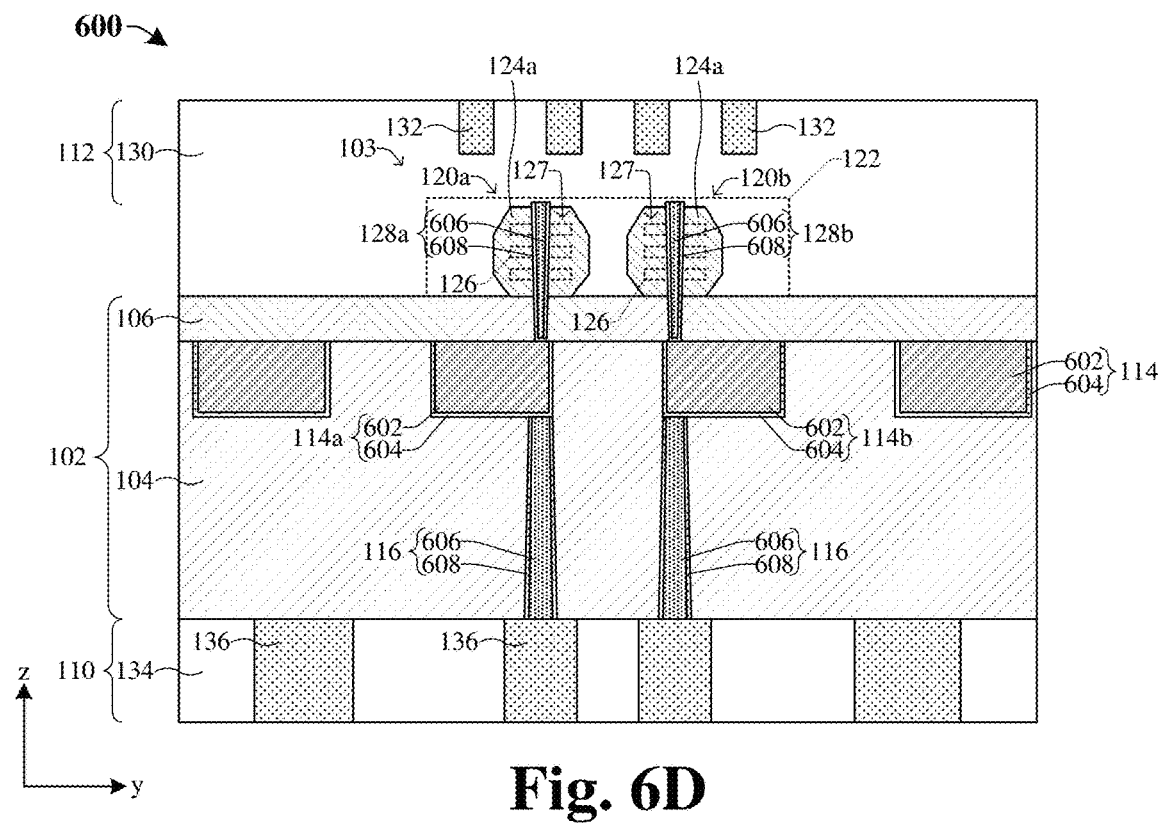

FIG. 6D illustrates a cross-sectional view of some alternative embodiments of the IC 600 of FIG. 6A, in which top surfaces of the first and second source/drain contacts 128a, 128b are disposed above top surfaces of the first source/drain structures 124a.

Figure 6E:
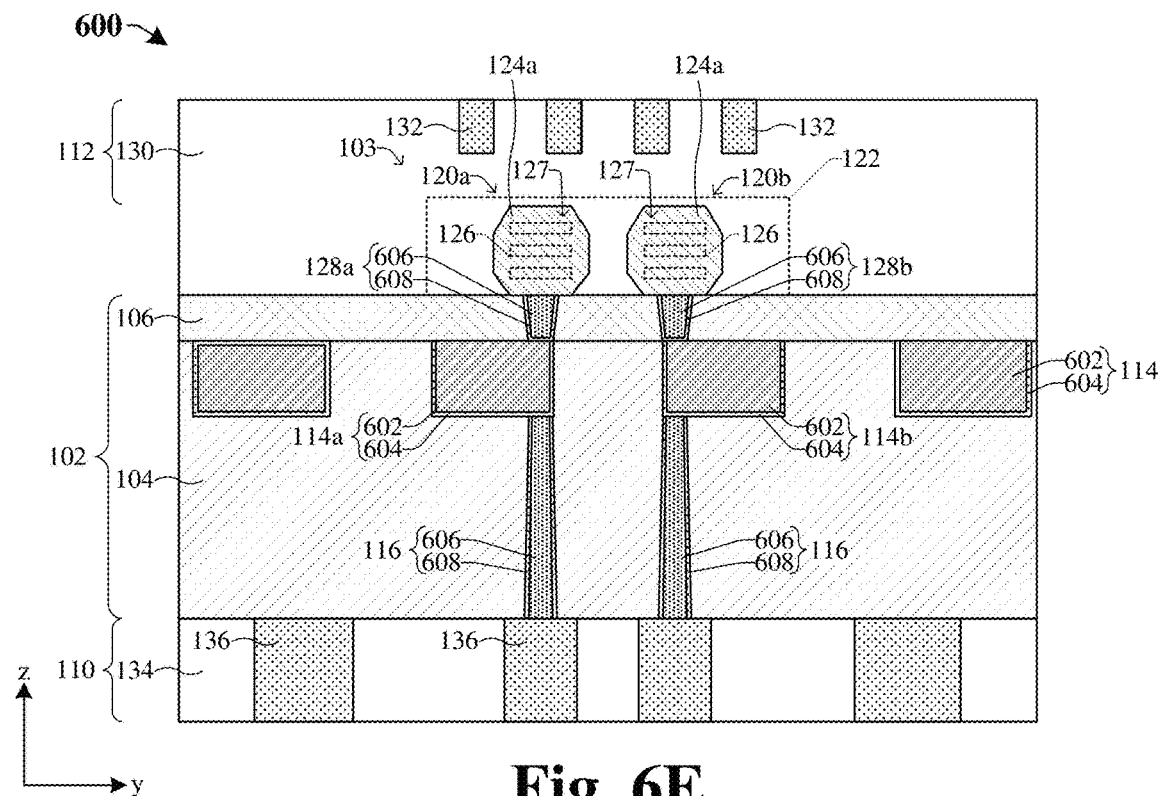

FIG. 6E illustrates a cross-sectional view of some alternative embodiments of the IC 600 of FIG. 6A, in which the first and second source/drain contacts 128a, 128b are disposed within the lower insulating structure 106. In such embodiments, top surfaces of the first and second source/drain contacts 128a, 128b are respectively aligned with a top surface of the lower insulating structure 106.

Figure 6F:
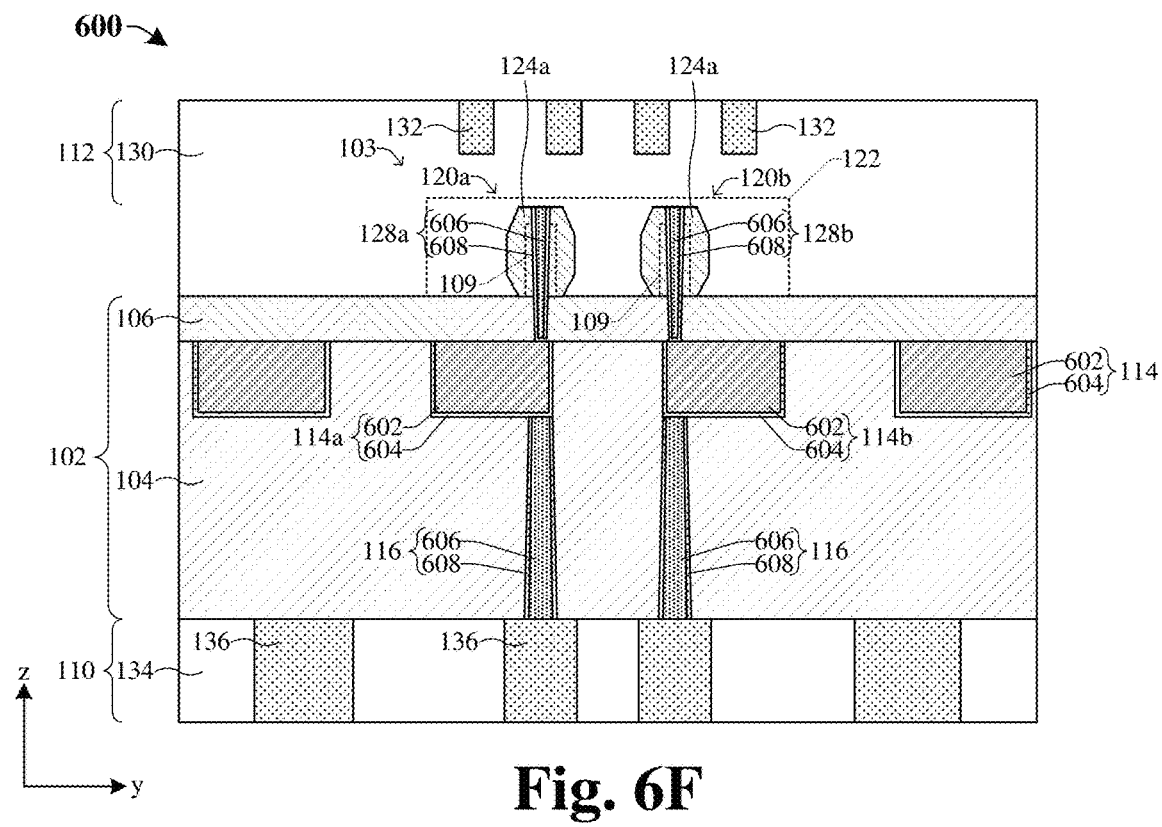

FIG. 6F illustrates a cross-sectional view of some alternative embodiments of the IC of FIG. 6A, in which the first and second FETs respectively comprise a fin 109 disposed along the lower insulating structure 106 and are respectively configured as a finFET. In various embodiments, top surfaces of the first and second source/drain contacts 128a, 128b are disposed above top surfaces of the fins 109.

Figure 7A:
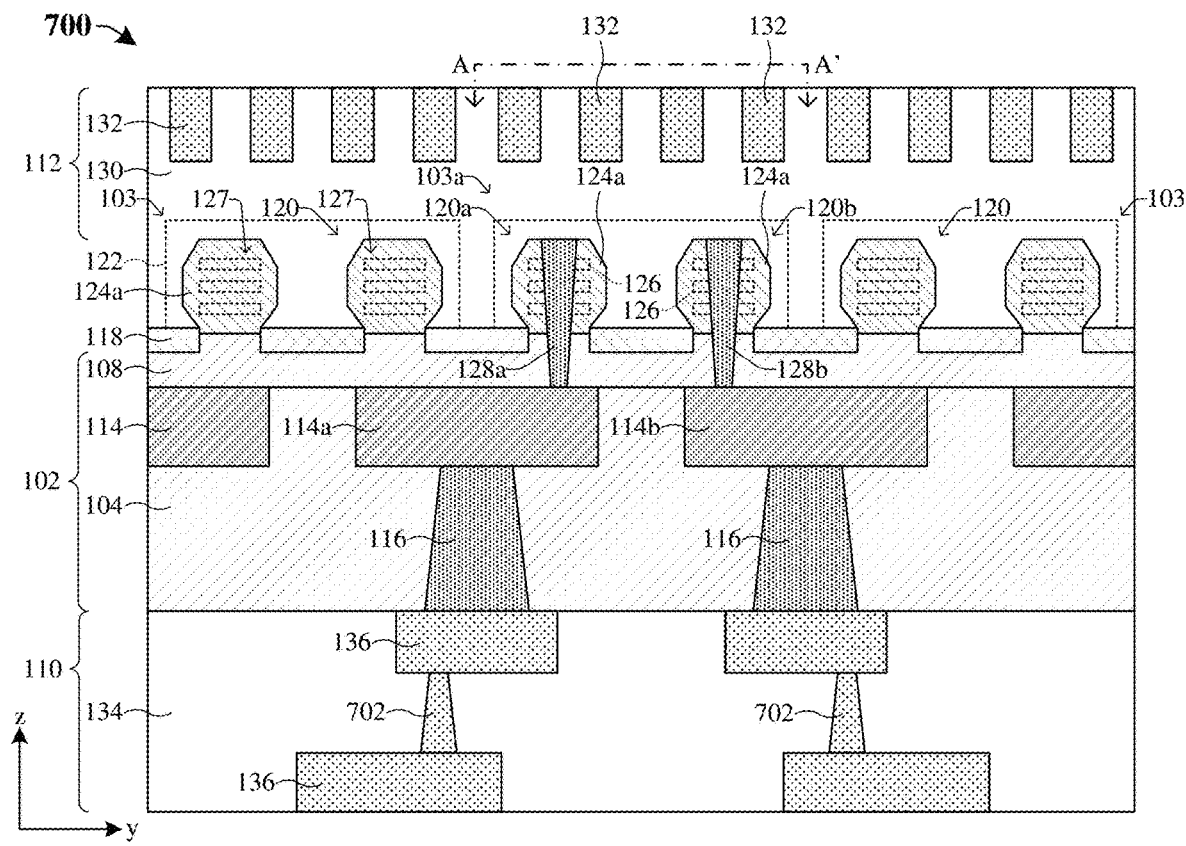
FIGS. 7A-7B and 8A-8B illustrate various views of some embodiments of an IC comprising a plurality of semiconductor devices disposed over a semiconductor substrate.
Figure 7B:
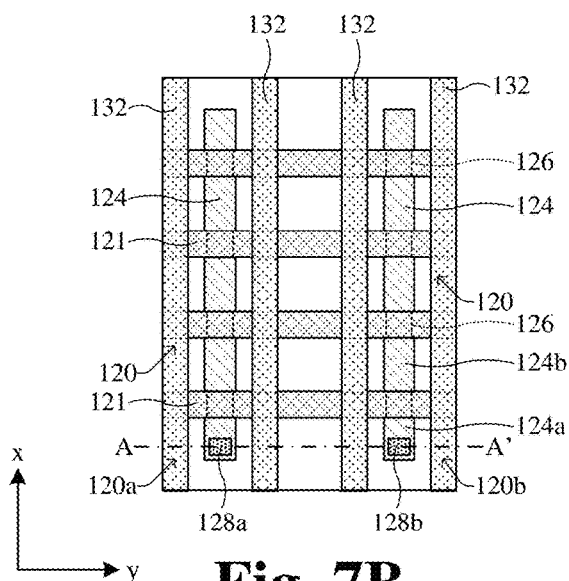

FIGS. 7A and 7B illustrate various views of some embodiments of an IC 700 corresponding to some alternative embodiments of the IC 100 of FIGS. 1A-1C. The IC 700 comprises a plurality of semiconductor devices 103 disposed on the semiconductor substrate 102. FIG. 7A illustrates a cross-sectional view of some embodiments of the IC 700 and FIG. 7B illustrates a layout view of some embodiments of the IC 700. In various embodiments, the cross-sectional view of FIG. 7A may be taken along the line A-A' of FIG. 7B.

In various embodiments, the plurality of semiconductor devices 103 comprise a plurality of FETs 120. In some embodiments, the plurality of FETs 120 directly overlies the plurality of power rails 114 that are embedded within the first substrate 104. The plurality of FETs 120 respectively includes a portion of the gate structure 122, the nanostructure stack 127, and source/drain structures 124. The plurality of semiconductor devices 103 includes a first semiconductor device 103a that comprises the first FET 120a laterally adjacent to the second FET 120b. In further embodiments, the first source/drain contact 128a continuously extends from the first source/drain structure 124a of the first FET 120a to the first power rail 114a, and the second source/drain contact 128b continuously extends from the first source/drain structure 124a of the second FET 120b to the second power rail 114b. In addition, the IC 700 includes the second interconnect structure 110 disposed along a bottom surface of the first substrate 104. In various embodiments, the second interconnect structure 110 comprises the second interconnect dielectric structure 134, the plurality of second conductive wires 136, and a plurality of second conductive vias 702. In various embodiments, the second conductive wires 136 and the second conductive vias 702 are electrically coupled to the plurality of power rails 114 by way of the TSVs 116.

Figure 8A:
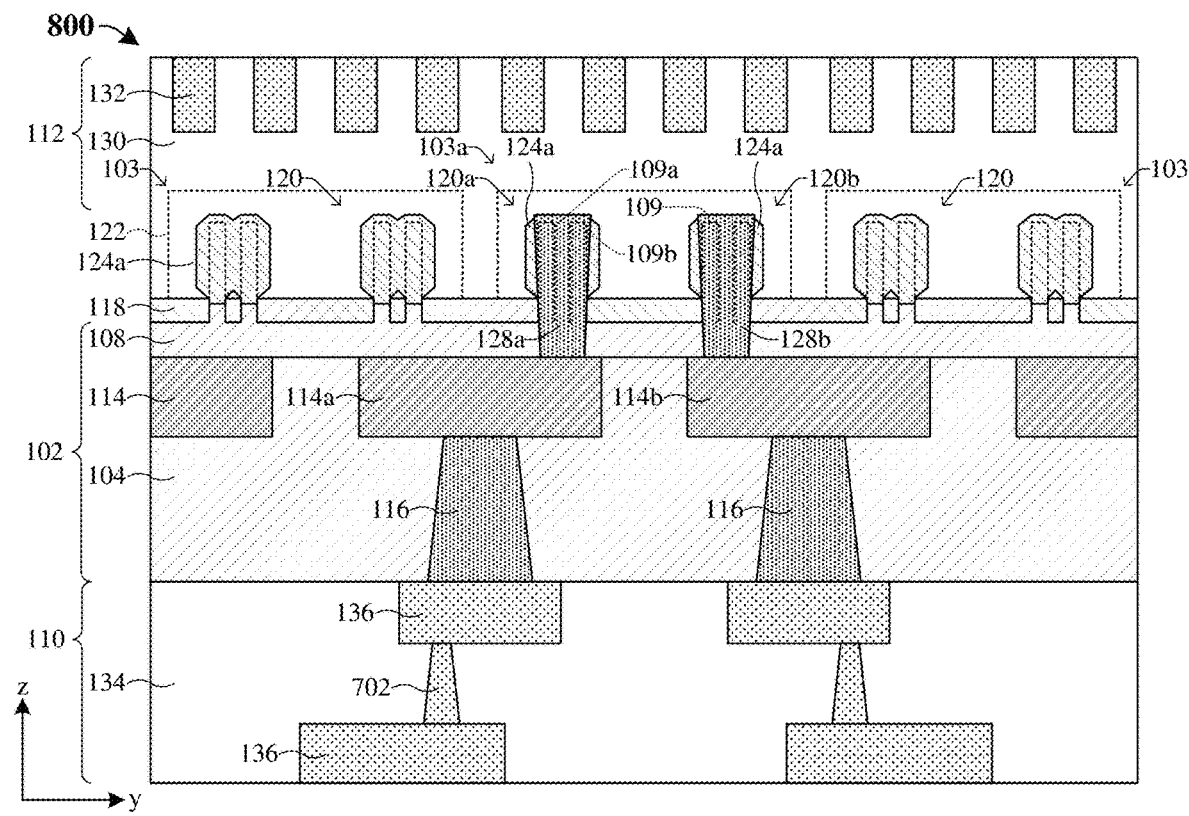

FIG. 8A illustrates a cross-sectional view of some embodiments of an IC 800 corresponding to some alternative embodiments of the IC 700 of FIGS. 7A and 7B, in which each FET in the plurality of FETs 120 is configured as a multi-fin transistor (e.g., a 2-fin transistor). In such embodiments, each FET comprises at least two fins 109 extending laterally in parallel with one another. For example, the first FET 120a comprises a first fin 109a laterally adjacent to a second fin 109b. In some embodiments, a width of the first source/drain contact 128a is greater than a distance between the first fin 109a and the second fin 109b.

Figure 8B:
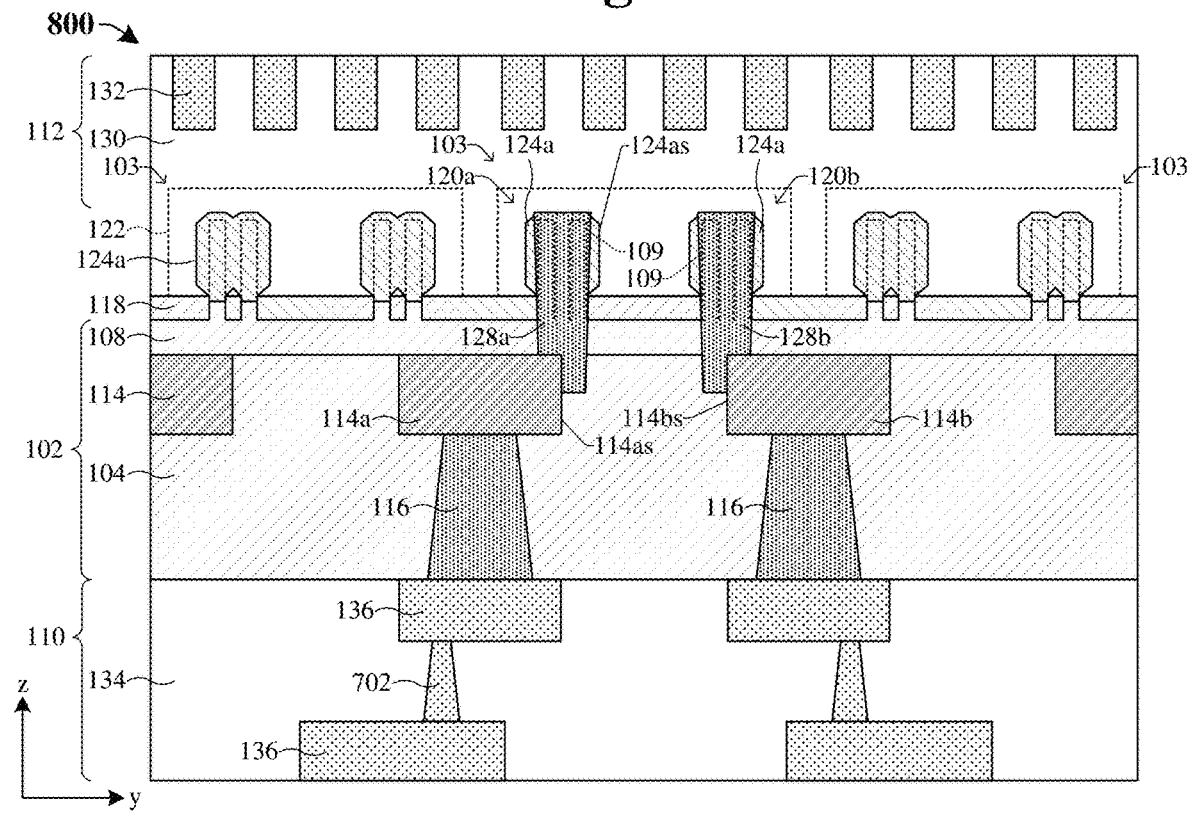

FIG. 8B illustrates a cross-sectional view of some embodiments of an IC 800 corresponding to some alternative embodiments of the IC 800 of FIG. 8A, in which the first source/drain contact 128a extends along a top surface of the first power rail 114a to a sidewall 114as of the first power rail 114a and the second source/drain contact 128b extends along a top surface of the second power rail 114b to a sidewall 114bs of the second power rail 114b. In some embodiments, the sidewall 114as of the first power rail 114a is laterally offset from a sidewall 124as of the first source/drain structure 124a of the first FET 120a in a direction away from the second power rail 114b. This, in part, increases a lateral distance between the first and second power rails 114a, 114b, thereby decreasing a capacitance between the plurality of power rails 114. By decreasing the capacitance between the plurality of power rails 114, an RC delay of the IC 800 is decreased, thereby increasing a performed of the IC 800.

FIGS. 9-21 illustrate various views of some embodiments of a method for forming an IC comprising a plurality of source/drain contacts continuously extending from a plurality of buried power rails to a plurality of FETs. Although the various views shown in FIGS. 9-21 are described with reference to a method, it will be appreciated that the structures shown in FIGS. 9-21 are not limited to the method but rather may stand alone separate of the method. Although FIGS. 9-21 are described as a series of acts, it will be appreciated that these acts are not limited in that the order of the acts can be altered in other embodiments, and the methods disclosed are also applicable to other structures. In other embodiments, some acts that are illustrated and/or described may be omitted in whole or in part.

Figure 9:
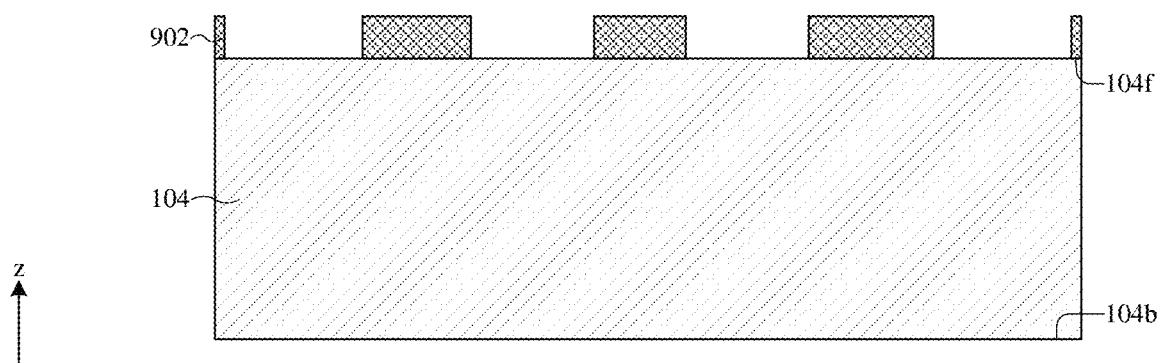

As shown in the cross-sectional view 900 of FIG. 9, a first substrate 104 is provided and a masking layer 902 is selectively formed over a front-side surface 104$f$ of the first substrate 104. The masking layer 902 leaves areas of the first substrate 104 exposed. The first substrate 104 comprises a back-side surface 104$b$ opposite the front-side surface 104$f$. In various embodiments, the first substrate 104 may, for example, be or comprise a semiconductor wafer (e.g., a silicon wafer), intrinsic monocrystalline silicon, another suitable substrate, or the like.

Figure 10:
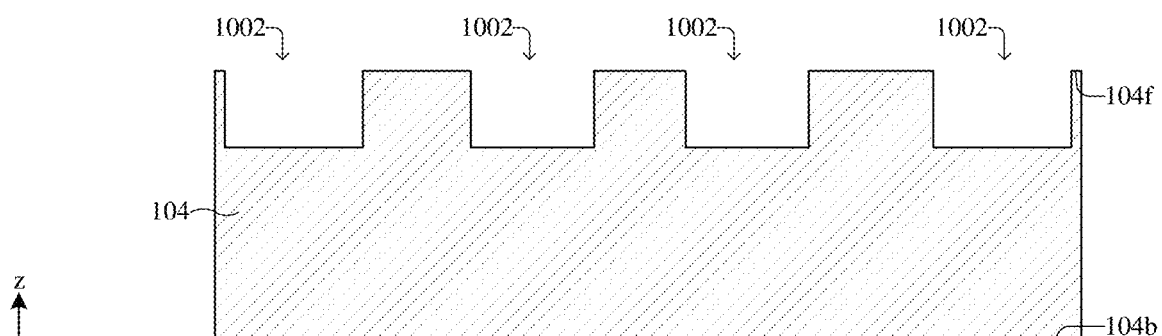

As shown in the cross-sectional view 1000 of FIG. 10, a patterning process is performed on the first substrate 104 according to the masking layer (902 of FIG. 9), thereby forming a plurality of openings 1002 in the first substrate 104. In various embodiments, the patterning process includes performing a dry etch process, a wet etch process, another suitable etch process, or any combination of the foregoing. In yet further embodiments, after the patterning process, a removal process is performed to remove the masking layer (902 of FIG. 9) from over the first substrate 104.

Figure 11:
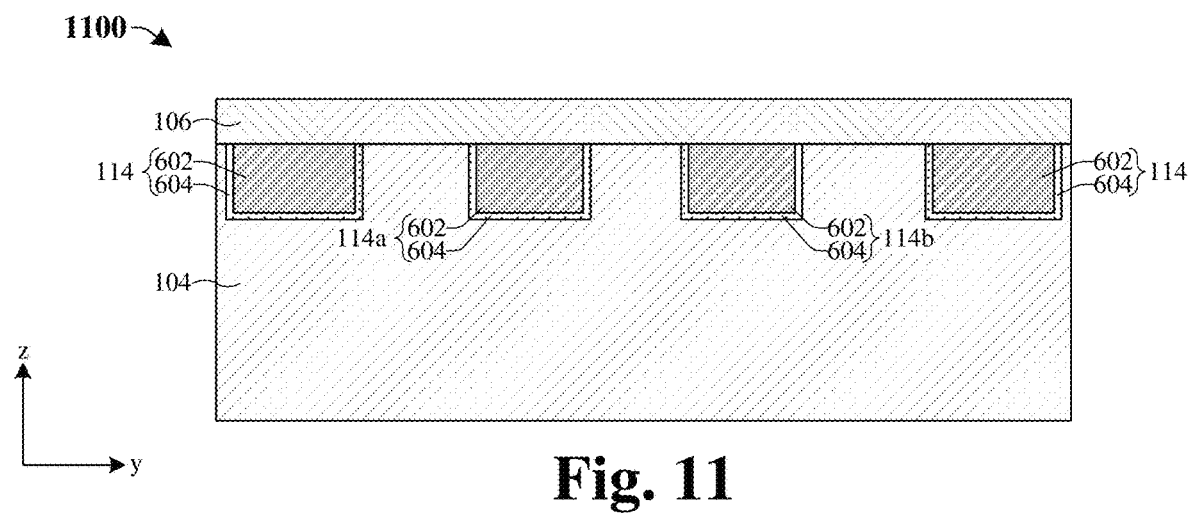

As shown in the cross-sectional view 1100 of FIG. 11, a plurality of power rails 114 is formed within the first substrate 104 and a lower insulating structure 106 is formed over the first substrate 104. In various embodiments, a process for forming the power rails 114 includes: depositing (e.g., by chemical vapor deposition (CVD), physical vapor deposition (PVD), electroplating, sputtering, or another suitable growth or deposition process) a first conductive liner 604 over the first substrate 104 such that the first conductive liner 604 lines the plurality of openings (1002 of FIG. 10); depositing a first conductive body 602 over the first conductive liner 604 such that the first conductive body 602 fills the openings (1002 of FIG. 10); and performing a planarization process (e.g., a chemical mechanical planarization (CMP) process) into the first conductive body 602 and the first conductive liner 604 until an upper surface of the first substrate 104 is reached, thereby defining the plurality of power rails 114. In some embodiments, a process for forming the lower insulating structure 106 may include depositing the lower insulating structure 106 over the first substrate 104 and the plurality of power rails 114 by a CVD process, a PVD process, an atomic layer deposition (ALD) process, or another suitable growth or deposition process.

In various embodiments, the first conductive body 602 may, for example, be or comprise tungsten, ruthenium, molybdenum, another conductive material, or any combination of the foregoing. In further embodiments, the first conductive liner 604 may, for example, be or comprise titanium nitride, tantalum nitride, another conductive material, or any combination of the foregoing. In yet further embodiments, the first conductive liner 604 may be configured as a diffusion barrier layer or an adhesion layer. In various embodiments, the lower insulating structure 106 may, for example, be or comprise silicon dioxide, silicon nitride, silicon carbide, another dielectric material, or any combination of the foregoing. In further embodiments, the plurality of power rails 114 includes a first power rail 114$a$ laterally adjacent to a second power rail 114$b$.

Figure 12:
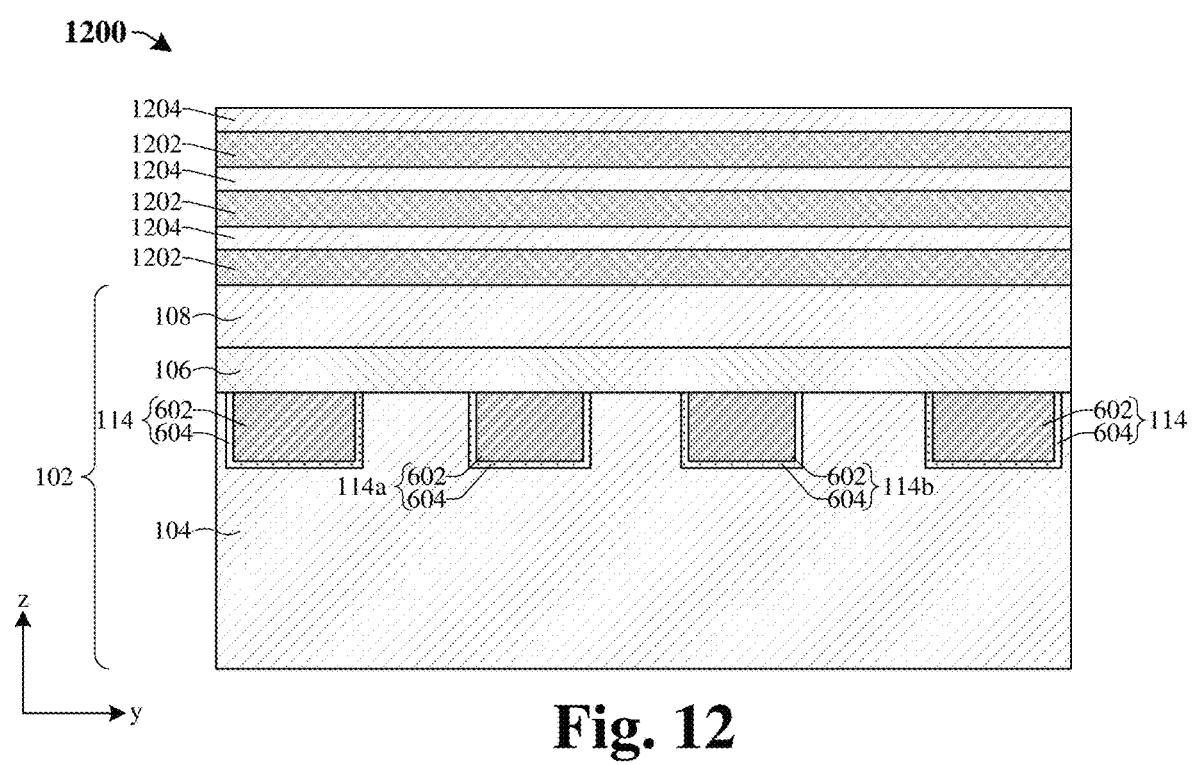

As shown in the cross-sectional view 1200 of FIG. 12, a second substrate 108 is formed over the lower insulating structure 106, and a plurality of first semiconductor layers 1202 and a plurality of second semiconductor layers 1204 are alternatingly formed over the second substrate 108. In various embodiments, the second substrate 108 may, for example, be or comprise a semiconductor wafer (e.g., a silicon wafer), intrinsic monocrystalline silicon, epitaxial silicon, another suitable substrate, or the like. In various embodiments, a process for forming the second substrate 108 over the lower insulating structure 106 includes bonding the second substrate 108 to the lower insulating structure 106. In various embodiments, the bonding may, for example, be performed by fusion bonding, vacuum bonding, or some other bonding process. In yet further embodiments, a process for forming the second substrate 108 comprises depositing the second substrate 108 by CVD, epitaxy, or another suitable deposition or growth process. For example, the second substrate 108 may be formed by molecular beam epitaxy (MBE), vapor phase epitaxy (VPE), liquid phase epitaxy (LPE), some other epitaxial process, or any combination of the foregoing. In some embodiments, forming the second substrate 108 over the lower insulating structure 106 defines a semiconductor substrate 102. In various embodiments, the semiconductor substrate 102 is a silicon-on-insulator (SOI) substrate comprising the first substrate 104, the lower insulating structure 106, and the second substrate 108.

In some embodiments, the plurality of first semiconductor layers 1202 may, for example, be formed by epitaxially growing silicon germanium or some other suitable material over the second substrate 108. In further embodiments, the plurality of second semiconductor layers 1204 may, for example, be formed by epitaxially growing silicon or some other suitable material over the second substrate 108. For example, the first semiconductor layers 1202 and/or the second semiconductor layers 1204 may be formed by MBE, VPE, LPE, some other epitaxial process, or any combination of the foregoing. In some alternative embodiments, the plurality of first semiconductor layers 1202 and the plurality of second semiconductor layers 1204 may be deposited rather than grown, and the deposition may, for example, comprise a CVD process, a PVD process, an ALD process, or some other suitable deposition process.

Figure 13A:
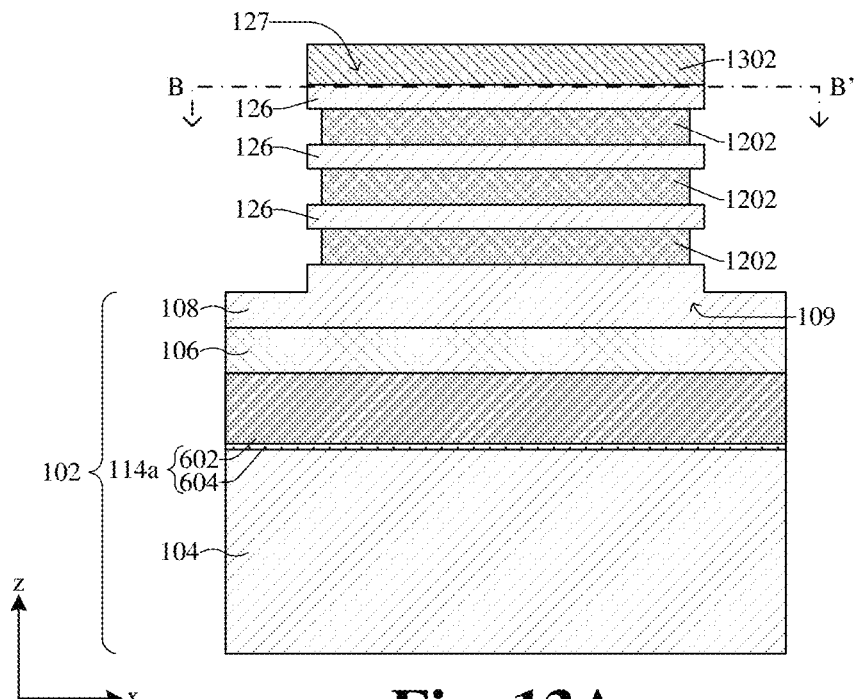
Figure 13B:
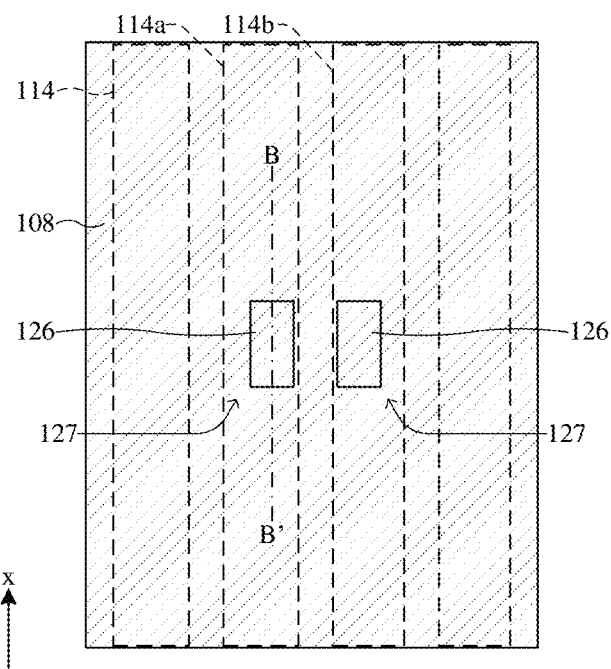

As shown in the various views of FIGS. 13A and 13B, a masking layer 1302 is formed over the second substrate 108 and a patterning process is performed on the plurality of first semiconductor layers 1202, the plurality of second semiconductor layers (1204 of FIG. 12), and the second substrate 108 according to the masking layer 1302 thereby forming fins 109 projecting from the second substrate and a nanostructure stack 127 overlying each fin 109. In some embodiments, the patterning process includes performing a dry etch process, a wet etch process, another suitable etch process, or any combination of the foregoing. In various embodiments, after the patterning process, a removal process is performed to remove the masking layer 1302 (not shown). In further embodiments, each nanostructure stack 127 comprises a plurality of nanostructures 126 directly overlying each fin 109. FIG. 13A illustrates some embodiments of a cross-sectional view 1300$a$ taken along the line B-B' of the top view 1300$b$ of FIG. 13B.

Figure 14A:
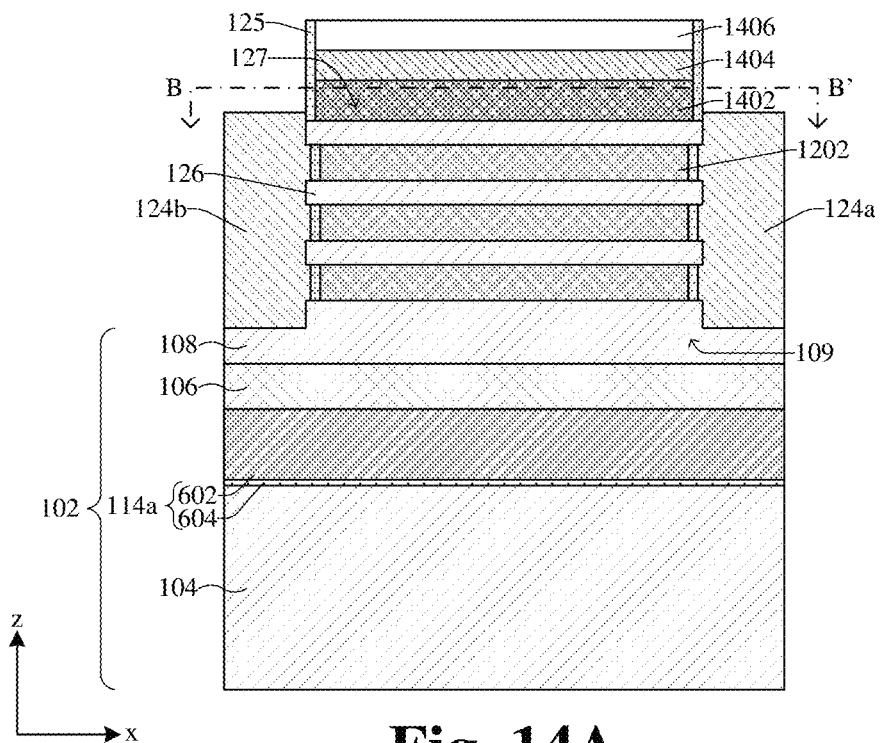
Figure 14B:
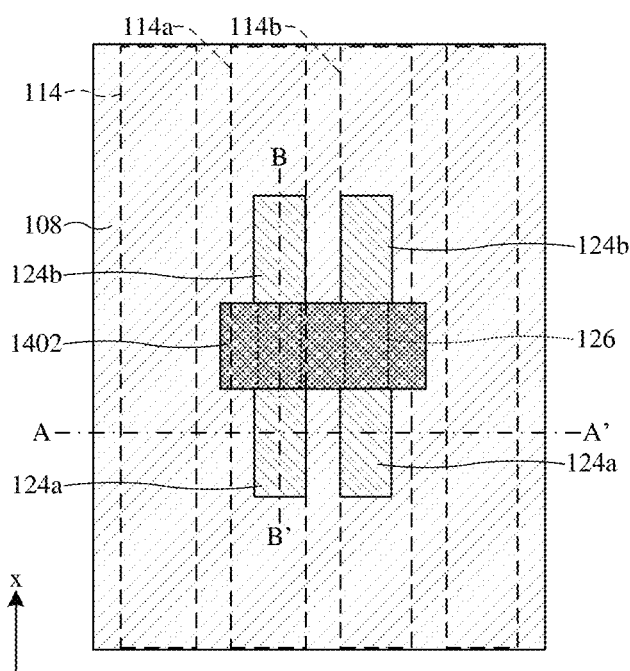

As shown in the various views of FIGS. 14A and 14B, a dummy gate structure 1402, a hard mask 1404, and a dielectric structure 1406 are formed over the second substrate 108. FIG. 14A illustrates some embodiments of a cross-sectional view 1400a taken along the line B-B' of the top view 1400b of FIG. 14B. In further embodiments, inner spacers 125 are formed along sidewalls of the first semiconductor layers 1202, sidewalls of the dummy gate structure 1402, sidewalls of the hard mask 1404, and sidewalls of the dielectric structure 1406. In various embodiments, a process for forming the inner spacers 125 includes depositing a dielectric layer (not shown) over the second substrate 108 and patterning the dielectric layer to form the inner spacers 125.

Further, as shown in FIGS. 14A and 14B, a pair of source/drain structures 124a-b is formed on opposing sides of each nanostructure stack 127. In various embodiments, the pair of source/drain structures 124a-b may, for example, be formed by epitaxially growing silicon germanium or some other suitable semiconductor material over the second substrate 108. For example, the pair of source/drain structures 124a-b may be formed by MBE, VPE, LPE, some other epitaxial process, or any combination of the foregoing. In some alternative embodiments, the pair of source/drain structures 124a-b may be deposited rather than grown and the deposition may, for example, comprise a CVD process, a PVD process, and ALD process, or some other suitable deposition process. In some embodiments, the pair of source/drain structures 124a-b may be doped (e.g., by an ion implantation process) such that the source/drain structures 124a-b comprise doped silicon germanium or some other suitable doped semiconductor material. In yet further embodiments, the pair of source/drain structures 124a-b include a first source/drain structure 124a laterally offset from a second source/drain structure 124b by the dummy gate structure 1402.

Figure 15A:
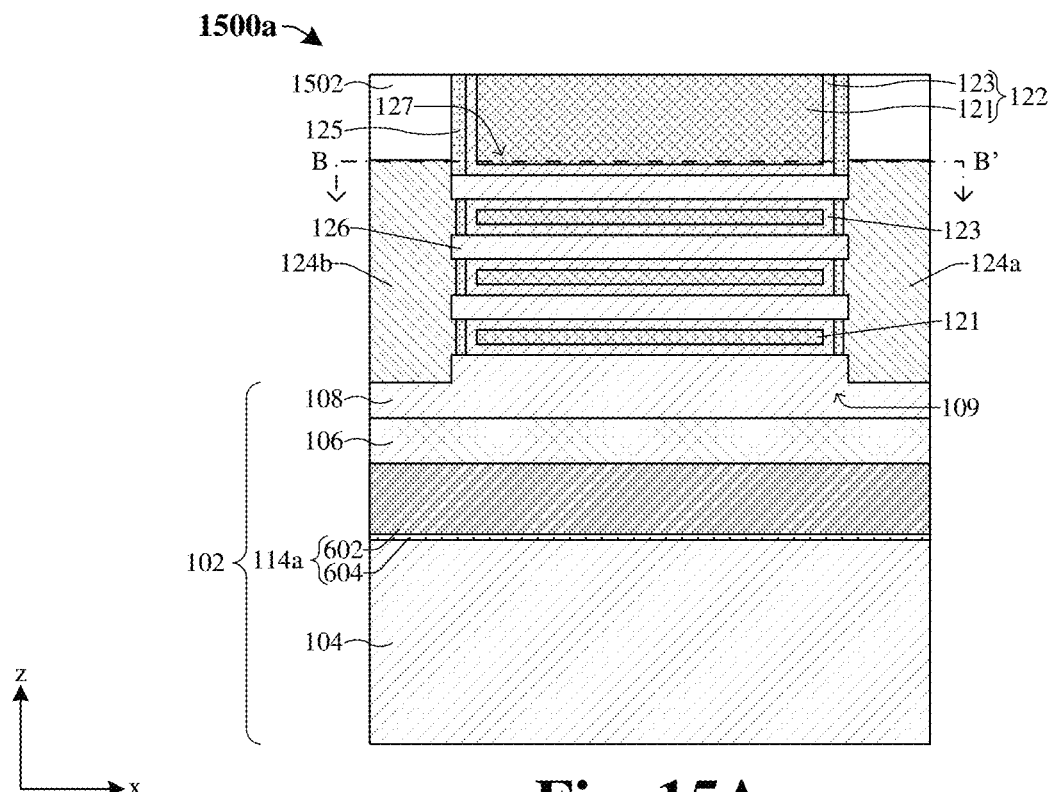
Figure 15B:
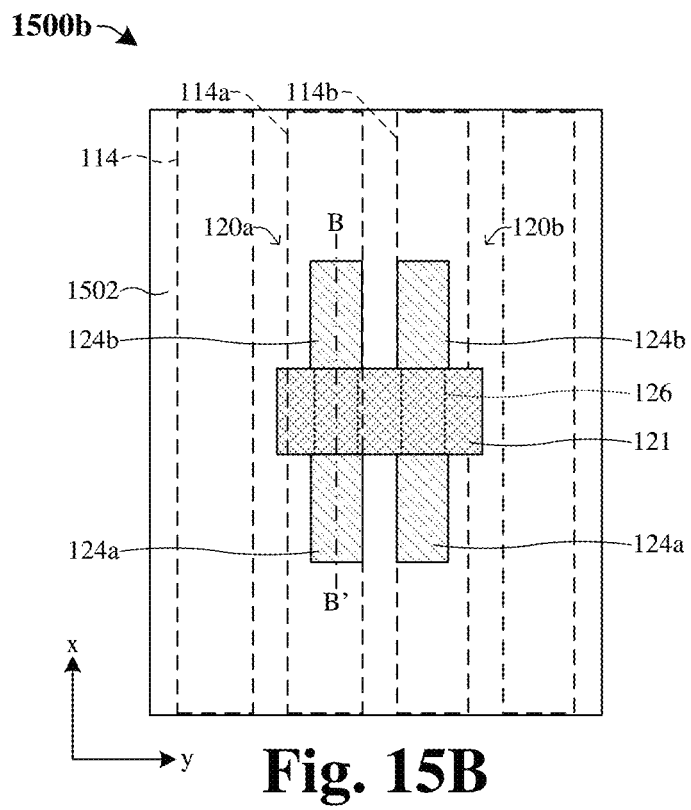

As shown in the various views of FIGS. 15A and 15B, a dielectric layer 1502 is formed over the second substrate 108. FIG. 15A illustrates some embodiments of a cross-sectional view 1500a taken along the line B-B' of the top view 1500b of FIG. 15B. In some embodiments, a process for forming the dielectric layer 1502 includes depositing the dielectric layer 1502 by, for example, a CVD process, a PVD process, an ALD process, or another suitable growth or deposition process.

Further, as illustrated in FIGS. 15A and 15B, a gate structure 122 is formed over and/or around the plurality of nanostructures 126, thereby defining a plurality of FETs 120a-b that includes a first FET 120a and a second FET 120b. The gate structure 122 comprises a gate electrode 121 and a gate dielectric layer 123 disposed between the nanostructures 126 and the gate electrode 121. In various embodiments, a process for forming the gate structure 122 includes: removing the dummy gate structure (1402 of FIG. 14A), the hard mask (1404 of FIG. 14A), and/or the dielectric structure (1406 of FIG. 14A); depositing (e.g., by CVD, PVD, ALD, etc.) the gate dielectric layer 123 over the second substrate 108 and around the nanostructures 126; and depositing (e.g., by CVD, PVD, ALD, sputtering, electroplating, electroless plating, or another suitable growth or deposition process) the gate electrode 121 over the second substrate 108 and around the nanostructures 126. In yet further embodiments, after depositing the gate electrode 121, a planarization process (e.g., a CMP process) is performed into the gate electrode 121 and the gate dielectric layer 123 such that an upper surfaces of the gate electrode 121, the gate dielectric layer 123, and the dielectric layer 1502 are co-planar.

In some embodiments, the dielectric layer 1502 may, for example, be or comprise silicon dioxide, a low-k dielectric material, an extreme low-k dielectric material, another suitable dielectric material, or any combination of the foregoing. In various embodiments, the gate dielectric layer 123 may, for example, be or comprise aluminum oxide, aluminum nitride, hafnium oxide, hafnium nitride, silicon dioxide, silicon nitride, a high-k dielectric material, another suitable dielectric material, or any combination of the foregoing. In yet further embodiments, the gate electrode 121 may, for example, be or comprise copper, cobalt, nickel, ruthenium, iridium, aluminum, platinum, palladium, gold, silver, molybdenum, tungsten, some other metal, some other conductive material, or any combination of the foregoing.

Figure 16A:
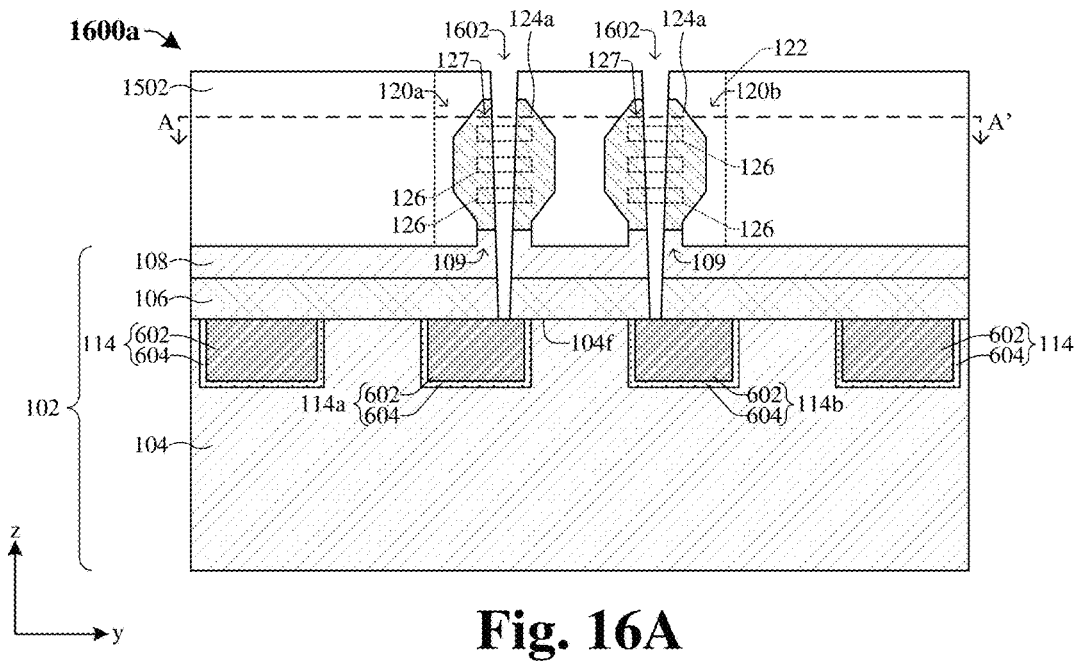
Figure 16B:
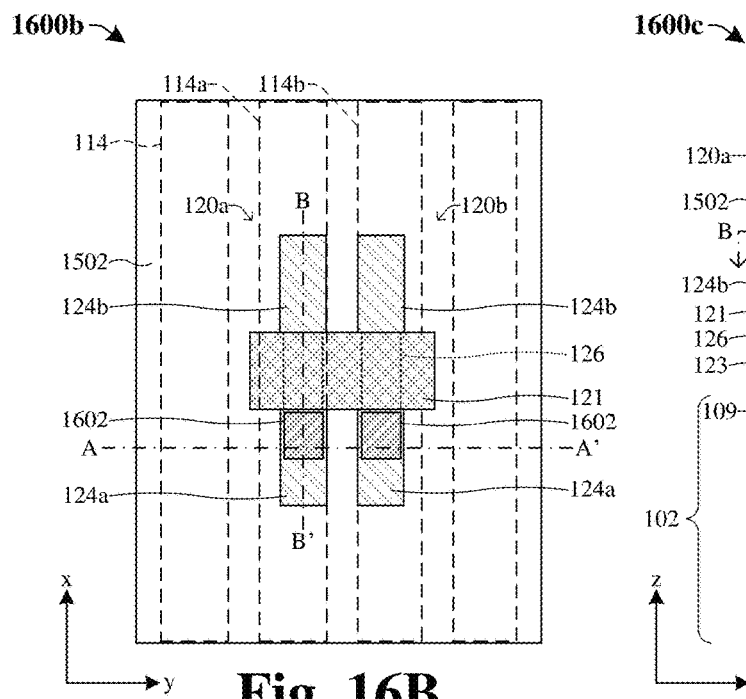
Figure 16C:
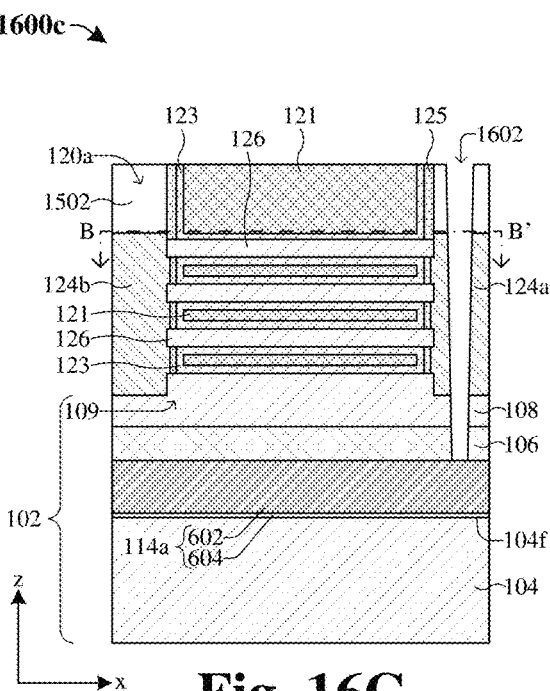

As shown in the various views of FIGS. 16A-16C, a patterning process is performed on the first source/drain structure 124a of the first FET 120a, the first source/drain structure 124a of the second FET 120b, the dielectric layer 1502, the second substrate 108, and the lower insulating structure 106 to form a plurality of contact openings 1602. In various embodiments, the patterning process includes: forming a masking layer (not shown) over the dielectric layer 1502; performing an etching process (e.g., a wet etch process, a dry etch process, another suitable etch process, or any combination of the foregoing) on the dielectric layer 1502 and underlying layers to form the plurality of contact openings 1602; and performing a removal process (not shown) to remove the masking layer. Further, the patterning process exposes a top surface of the first power rail 114a and a top surface of the second power rail 114b. FIG. 16A illustrates some embodiments of a cross-sectional view 1600a taken along the line A-A' of the top view 1600b of FIG. 16B. Further, FIG. 16C illustrates some embodiments of another cross-sectional view 1600c taken along the line B-B' of the top view 1600b of FIG. 16B.

As shown in the various views of FIGS. 17A-17C, a plurality of source/drain contacts 128a-b is formed within the plurality of contact openings (1602 of FIGS. 16A-C) and a first dielectric structure 1702 is formed over the second substrate 108. In some embodiments, the source/drain contacts 128a-b respectively comprise a second conductive body 606 and a second conductive liner 608 that laterally surrounds the second conductive body 606. FIG. 17A illustrates some embodiments of a cross-sectional view 1700a taken along the line A-A' of the top view 1700b of FIG. 17B. Further, FIG. 17C illustrates some embodiments of another cross-sectional view 1700c taken along the line B-B' of the top view 1700b of FIG. 17B.

In various embodiments, a process for forming the source/drain contacts 128a-b includes: depositing (e.g., by CVD, PVD, electroplating, sputtering, or another suitable growth or deposition process) the second conductive liner 608 over the second substrate 108 such that the second conductive liner 608 lines the plurality of contact openings (1602 of FIGS. 16A-C); and depositing (e.g., by CVD, PVD, electroplating, sputtering, or another suitable growth or deposition process) the second conductive body 606 over the second conductive liner 608 such that the second conductive body 606 fills the contact openings (1602 of FIGS. 16A-C), thereby defining the plurality of source/drain contacts 128a-b. In various embodiments, an etch back process or a CMP process may be performed on the second conductive liner 608 and/or the second conductive body 606 after depositing the second conductive body 606. In further embodiments, the plurality of source/drain contacts 128a-b includes a first source/drain contact 128a directly overlying the first power rail 114a and a second source/drain contact 128b directly overlying the second power rail 114b. The first source/drain contact 128a is disposed within the first source/drain structure 124a of the first FET 120a and is configured to electrically couple the first source/drain structure 124a of the first FET 120a to the first power rail 114a. The second source/drain contact 128b is disposed within the first source/drain structure 124a of the second FET 120b and is configured to electrically couple the first source/drain structure 124a of the second FET 120b to the second power rail 114b.

In some embodiments, a process for forming the first dielectric structure 1702 may include depositing the first dielectric structure 1702 over the second substrate 108 and the plurality of source/drain contacts 128a-b by a CVD process, a PVD process, an ALD process, or another suitable growth or deposition process. In yet further embodiments, the dielectric layer (1502 of FIGS. 16A-C) is part of the first dielectric structure 1702. In some embodiments, the first dielectric structure 1702 may, for example, be or comprise silicon dioxide, a low-k dielectric material, an extreme low-k dielectric material, another suitable dielectric material, or any combination of the foregoing. In various embodiments, the second conductive body 606 may, for example, be or comprise tungsten, ruthenium, molybdenum, copper, aluminum, another conductive material, or any combination of the foregoing. In further embodiments, the second conductive liner 608 may, for example, be or comprise titanium, tantalum, titanium nitride, tantalum nitride, another conductive material, or any combination of the foregoing. In yet further embodiments, the second conductive liner 608 may be configured as a diffusion barrier layer or an adhesion layer.

Figure 18A:
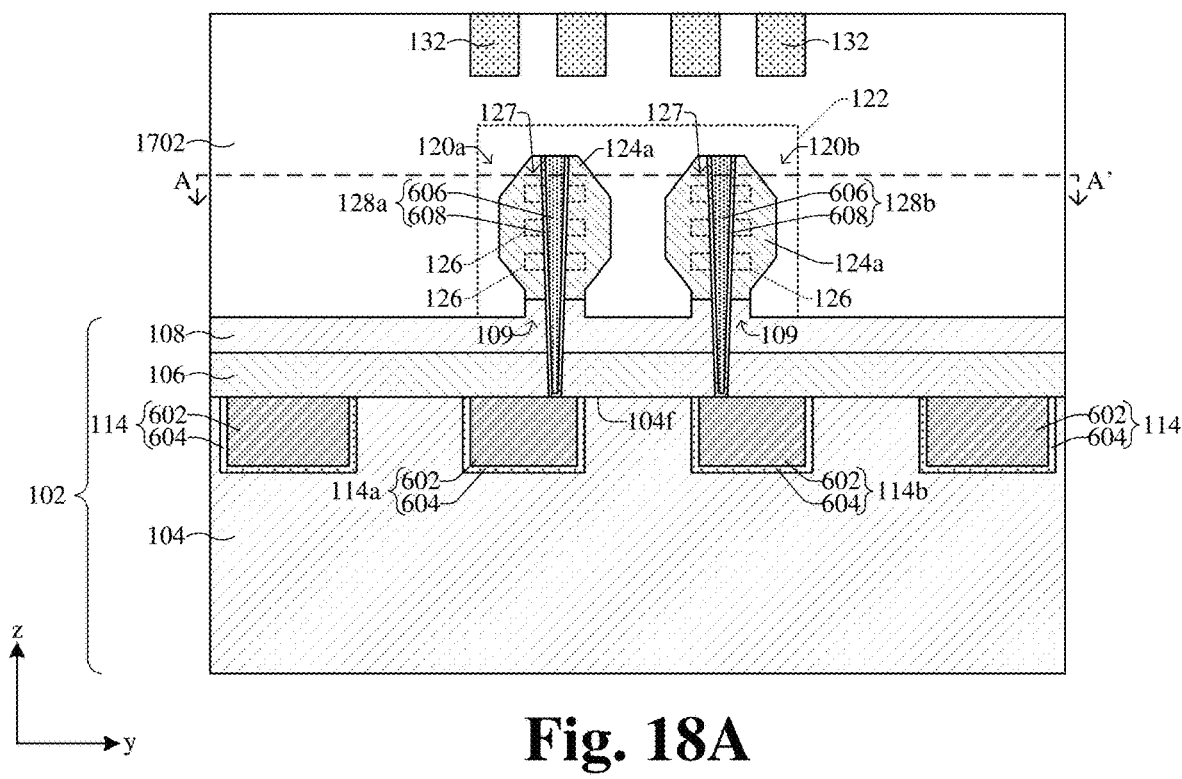
Figure 18B:
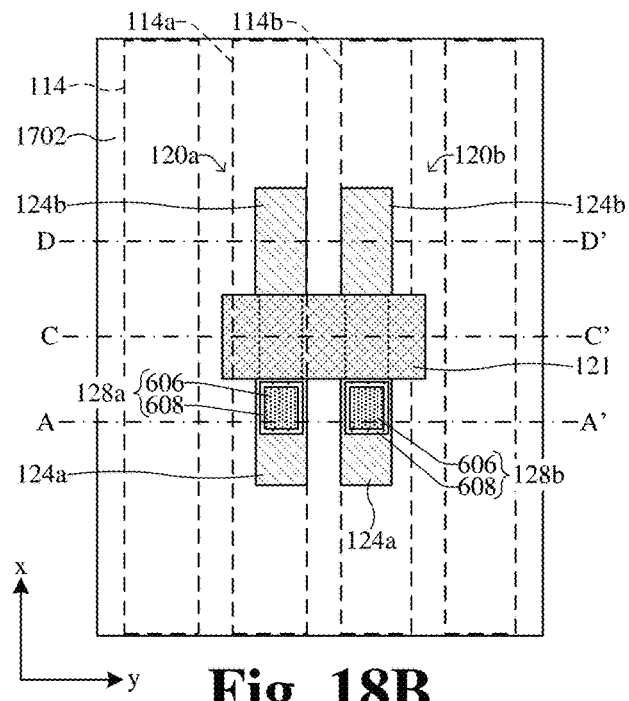
Figure 18C:
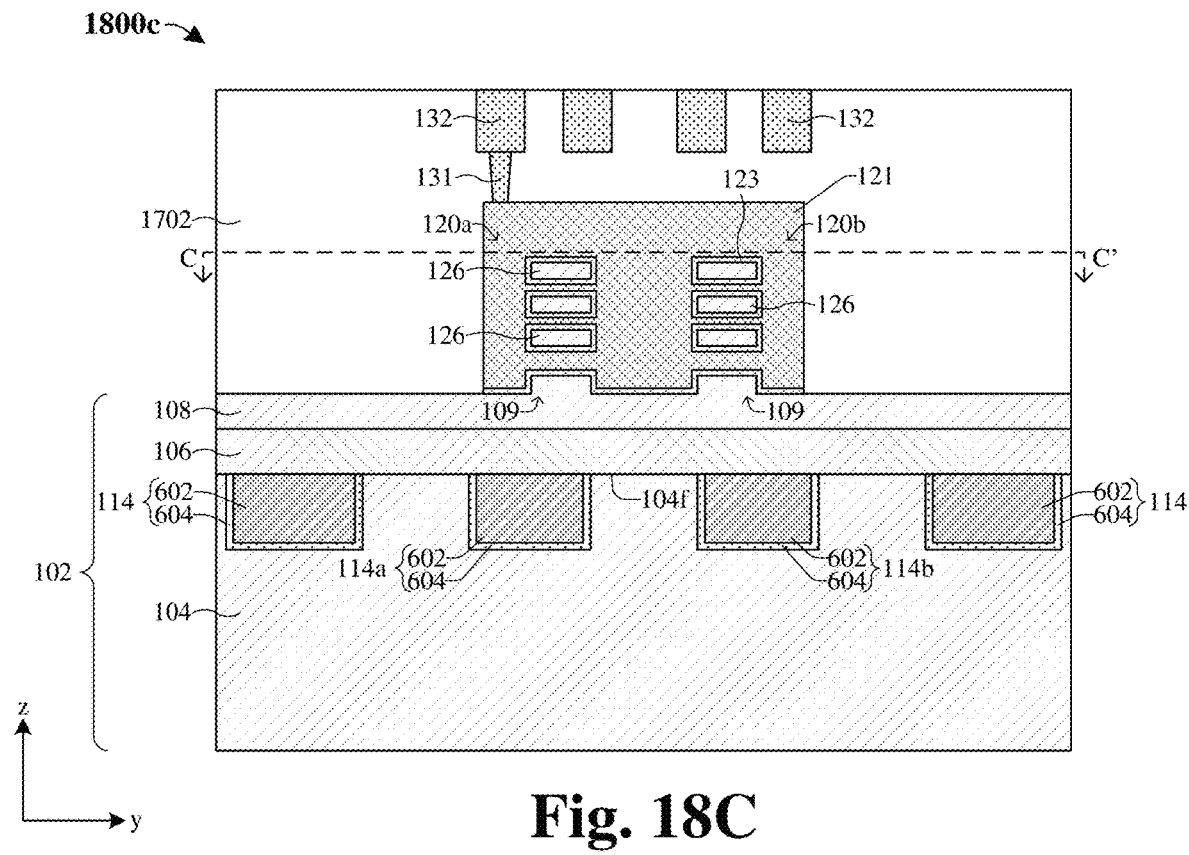
Figure 18D:
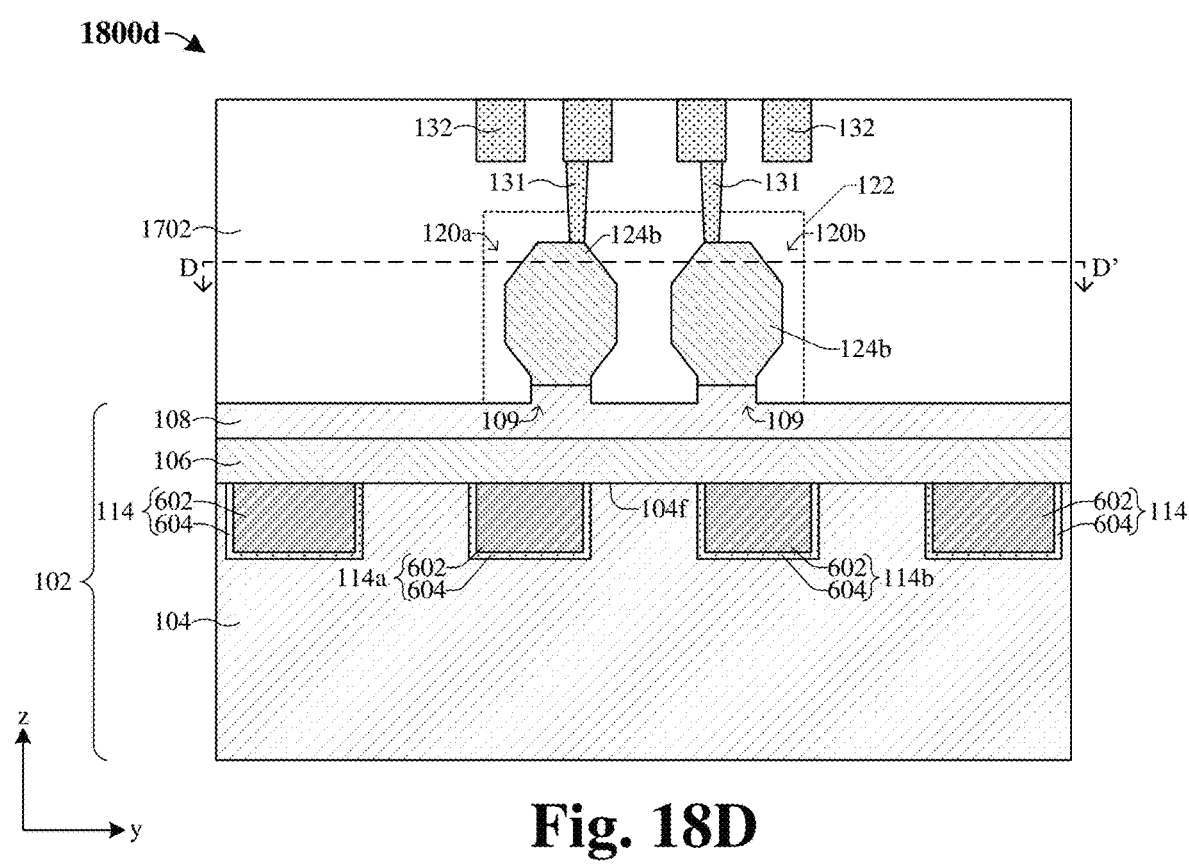

As shown in the various views of FIGS. 18A-18D, a plurality of first conductive vias 131 and a plurality of first conductive wires 132 are formed within the first dielectric structure 1702 over the plurality of FETs 120a-b. In various embodiments, the first conductive vias and/or wires 131, 132 may be formed by one or more deposition process(es), one or more patterning process(es), one or more planarization process(es), or some other suitable process(es). In further embodiments, the first conductive vias and/or wires 131, 132 may, for example, respectively comprise titanium, tantalum, titanium nitride, tantalum nitride, copper, aluminum, another conductive material, or any combination of the foregoing. FIG. 18A illustrates some embodiments of a cross-sectional view 1800a taken along the line A-A' of the top view 1800b of FIG. 18B. FIG. 18C illustrates some embodiments of another cross-sectional view 1800c taken along the line C-C' of the top view 1800b of FIG. 18B. FIG. 18D illustrates some embodiments of another cross-sectional view 1800d taken along the line D-D' of the top view 1800b of FIG. 18B. In various embodiments, as illustrated in the cross-sectional view 1800d of FIG. 18D, a conductive via in the plurality of first conductive vias 131 directly overlies and contacts the second source/drain structure 124b of the first FET 120a, and another conductive via in the plurality of first conductive vias 131 directly overlies and contacts the second source/drain structure 124b of the second FET 120b.

Figure 19:
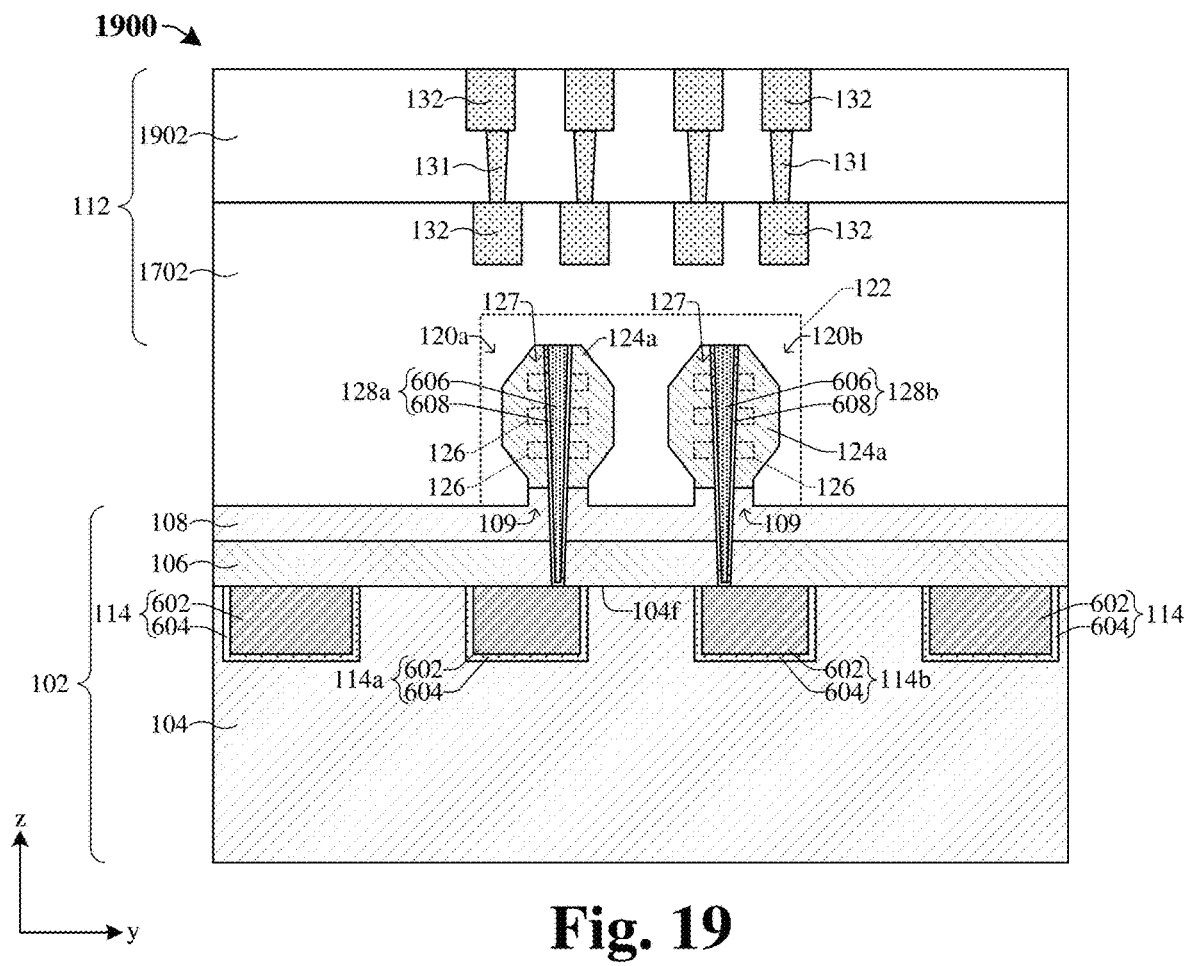

As shown in the cross-sectional view 1900 of FIG. 19, a second dielectric structure 1902, first conductive vias 131, and first conductive wires 132 are formed over the plurality of FETs 120a-b, thereby defining a first interconnect structure 112 over the second substrate 108. In various embodiments, a process for forming the second dielectric structure 1902 includes depositing the second dielectric structure 1902 over the first dielectric structure 1702 by a CVD process, a PVD process, an ALD process, or another suitable growth or deposition process. In some embodiments, the second dielectric structure 1902 may, for example, be or comprise silicon dioxide, a low-k dielectric material, an extreme low-k dielectric material, another suitable dielectric material, or any combination of the foregoing. In some embodiments, a process for forming the first interconnect structure 112 includes the processing steps illustrated and/or described in FIGS. 17A-17C through 19.

Figure 20:
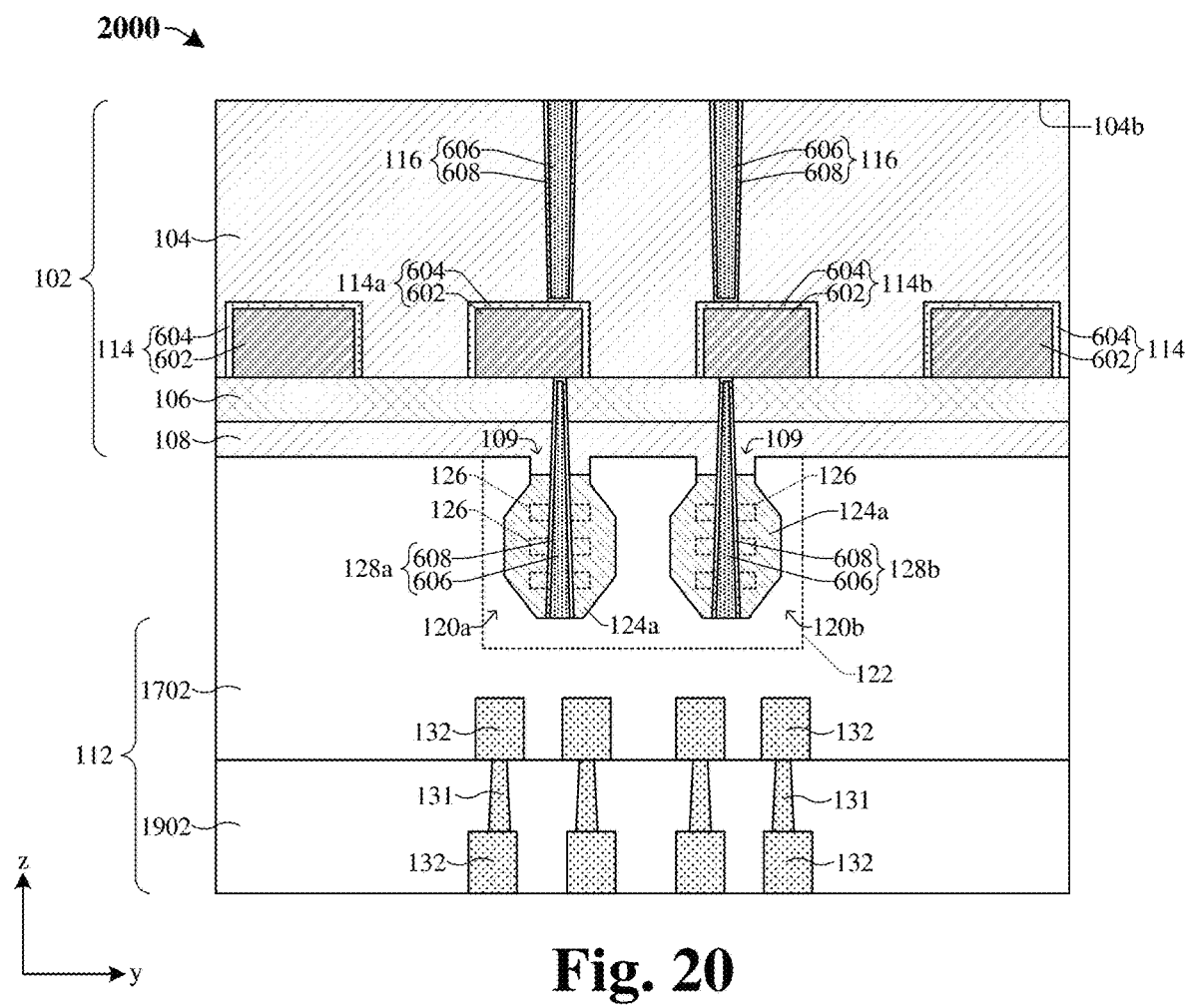

As shown in the cross-sectional view 2000 of FIG. 20, the structure of FIG. 19 is flipped and a plurality of through-substrate vias (TSVs) 116 is formed into the back-side surface 104b of the first substrate 104. In various embodiments, a process for forming the plurality of TSVs 116 includes: forming a masking layer (not shown) over the back-side surface 104b of the first substrate 104; patterning the first substrate 104 according to the masking layer to form a plurality of trenches (not shown) in the first substrate 104; depositing (e.g., by CVD, PVD, sputtering, electroplating, or another suitable growth or deposition process) a conductive liner layer (not shown) over the first substrate 104 such that the conductive liner layer lines the trenches; depositing (e.g., by CVD, PVD, sputtering, electroplating, or another suitable growth or deposition process) a conductive material (not shown) over the conductive liner layer such that the conductive material fills a remainder of the trenches; and performing a planarization process (e.g., a CMP process) into the conductive liner layer and the conductive material until the first substrate 104 is reached, thereby defining the plurality of TSVs 116. In further embodiments, the plurality of TSVs 116 comprise the second conductive body 606 and the second conductive liner 608.

Figure 21:
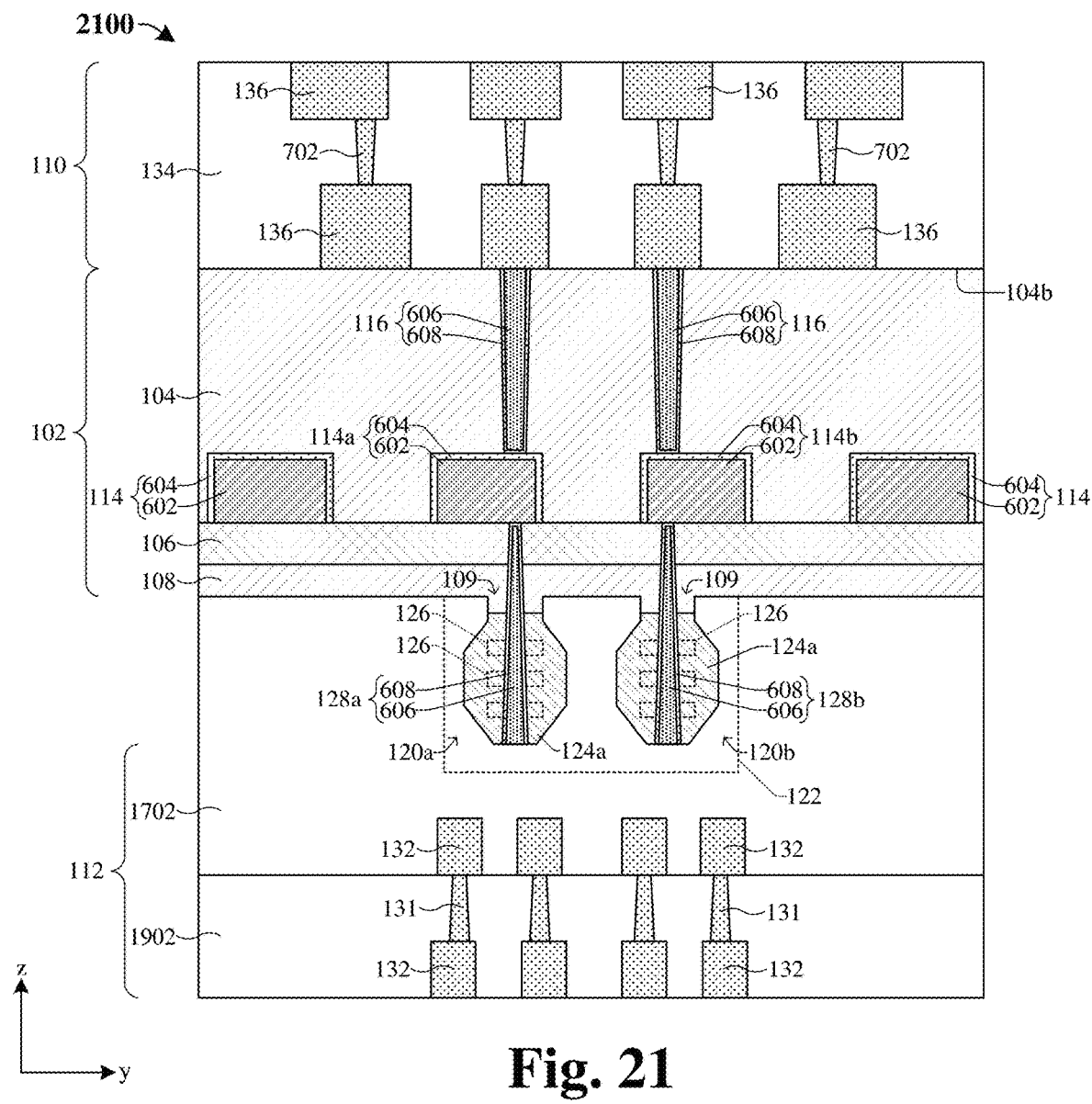

As shown in the cross-sectional view 2100 of FIG. 21, a second interconnect structure 110 is formed along the back-side surface 104b of the first substrate 104. The second interconnect structure 110 includes a second interconnect dielectric structure 134, a plurality of second conductive wires 136 and a plurality of second conductive vias 702 disposed within the second interconnect dielectric structure 134. In some embodiments, forming the second interconnect structure 110 may include one or more deposition process(es), one or more patterning process(es), one or more planarization process(es), or some other suitable process (es). In some embodiments, the second interconnect dielectric structure 134 may, for example, be or comprise silicon dioxide, a low-k dielectric material, an extreme low-k dielectric material, another suitable dielectric material, or any combination of the foregoing. In yet further embodiments, the second conductive wires 136 and/or the second conductive vias 702 may, for example, respectively be or comprise titanium, tantalum, titanium nitride, tantalum nitride, ruthenium, aluminum, copper, another conductive material, or any combination of the foregoing.

Figure 22:
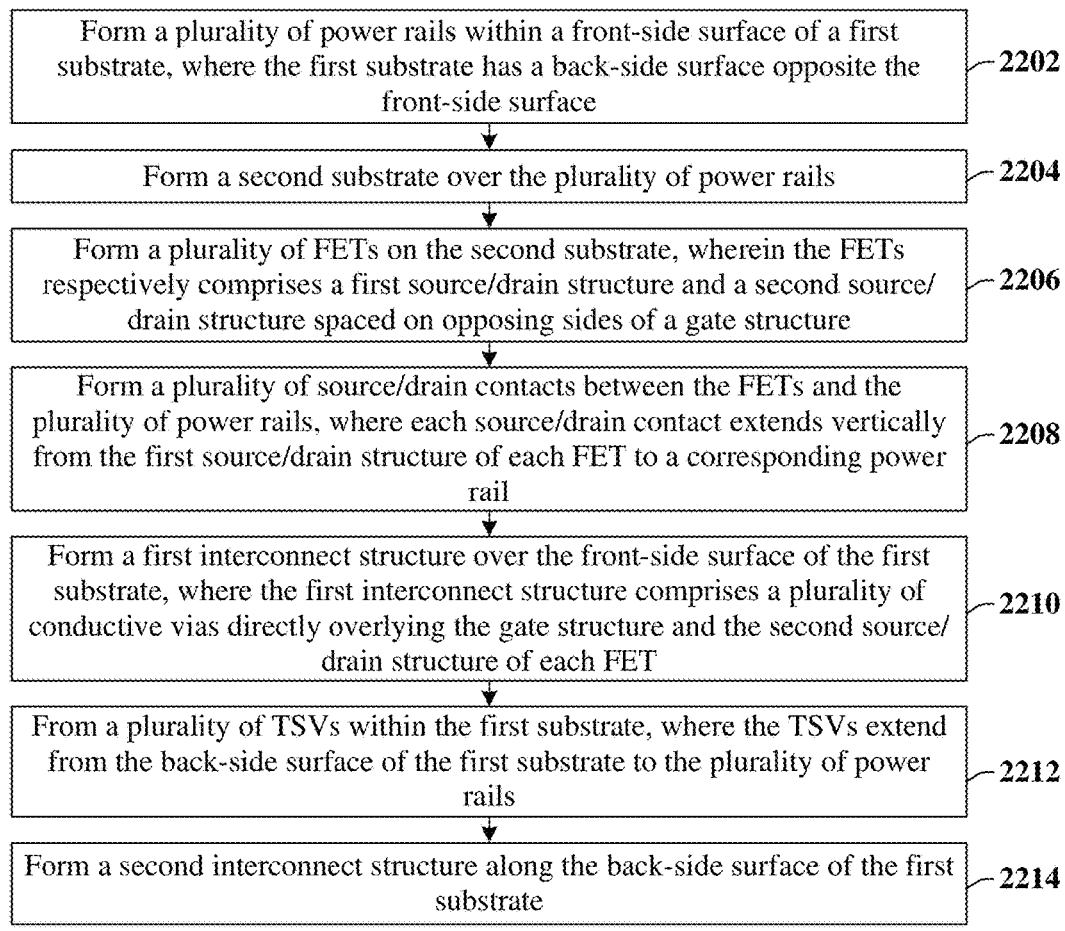
FIG. 22 illustrates a flow diagram of some embodiments of a method for forming an IC comprising a plurality of source/drain contacts continuously extending from a plurality of buried power rails to a plurality of FETs.

FIG. 22 illustrates a flow diagram of some embodiments of a method 2200 for forming an integrated chip (IC) having a plurality of power rails embedded in a first substrate and a plurality of source/drain contacts continuously extending from the buried power rails to a plurality of FETs. While method 2200 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein.

Further, one or more of the acts depicted herein may be carried out in one or more separate acts and/or phases.

At act 2202, a plurality of power rails is formed within a front-side surface of a first substrate, where the first substrate has a back-side surface opposite the front-side surface. FIGS. 9-11 illustrate cross-sectional views 900-1100 of some embodiments corresponding to act 2202. FIGS. 23-29 illustrate cross-sectional views 2300-2900 of some alternative embodiments corresponding to act 2202.

At act 2204, a second substrate is formed over the plurality of power rails. FIG. 12 illustrates a cross-sectional view 1200 of some embodiments corresponding to act 2204. FIGS. 25-30 illustrate cross-sectional views 2500-3000 of some alternative embodiments corresponding to act 2204.

At act 2206, a plurality of FETs is formed on the second substrate, where the FETs respectively comprise a first source/drain structure and a second source/drain structure spaced on opposing sides of a gate structure. FIGS. 12-15B illustrate various views of some embodiments corresponding to act 2206.

At act 2208, a plurality of source/drain contacts is formed between the FETs and the plurality of power rails, where each source/drain contact extends vertically from the first source/drain structure of each FET to a corresponding power rail. FIGS. 16A-16C through 17A-17C illustrate various views of some embodiments corresponding to act 2208.

At act 2210, a first interconnect structure is formed over the front-side surface of the first substrate. The first interconnect structure comprises a plurality of conductive vias directly overlying the gate structure and the second source/drain structure of each FET. FIGS. 18A-18D through 19 illustrate various views of some embodiments corresponding to act 2210.

At act 2212, a plurality of TSVs is formed within the first substrate. The TSVs extend from the back-side surface of the first substrate to the plurality of power rails. FIG. 20 illustrates a cross-sectional view 2000 of some embodiments corresponding to act 2212.

At act 2214, a second interconnect structure is formed along the back-side surface of the first substrate. FIG. 21 illustrates a cross-sectional view 2100 of some embodiments corresponding to act 2214.

FIGS. 23-32 illustrate cross-sectional views 2300-3200 of some embodiments of a second method for forming an IC having a plurality of power rails embedded in a first substrate and a plurality of source/drain contacts continuously extending from the buried power rails to a plurality of FETs. For example, FIGS. 23-32 illustrate alternative embodiments of acts that may be performed in the place of the acts at FIGS. 9-13B of the method of FIGS. 9-21. Thus, in some embodiments, the second method includes a method that alternatingly proceeds from FIGS. 23-32 to FIGS. 14A-21 (i.e., skipping FIGS. 9-13B).

Figure 23:
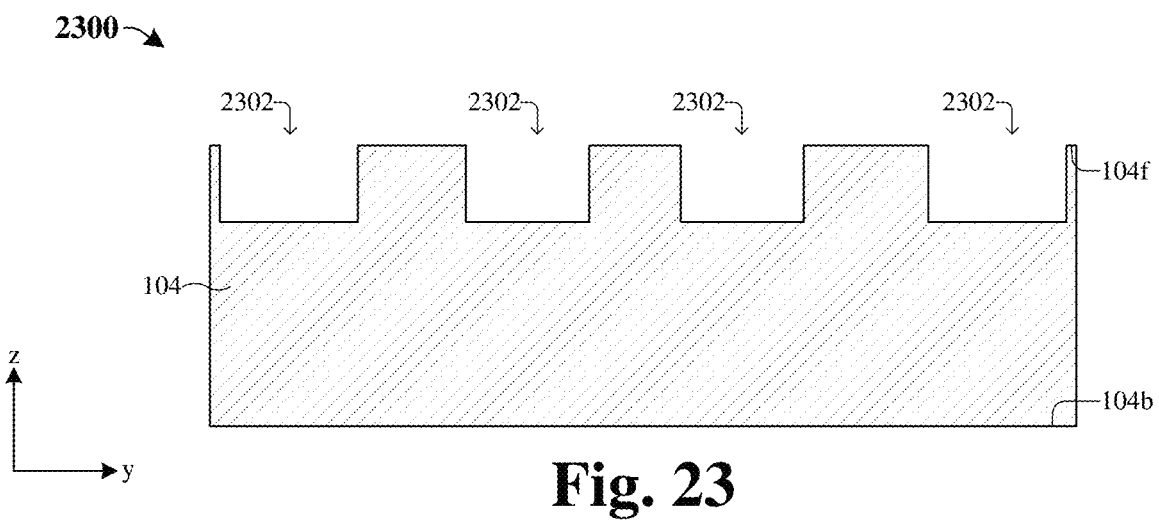
FIGS. 23-32 illustrate cross-sectional views of some alternative embodiments of the method of FIGS. 9-21.

As illustrated by the cross-sectional view 2300 of FIG. 23, a first substrate 104 is provided and a patterning process is performed on a front-side surface 104f of the first substrate 104, thereby forming a plurality of openings 2302 in the first substrate 104. In various embodiments, the patterning process includes: forming a masking layer (not shown) over the front-side surface 104f of the first substrate 104; performing an etching process on the first substrate 104 according to the masking layer, thereby forming the plurality of openings 2302; and performing a removal process to remove the masking layer from over the first substrate 104 (not shown). In further embodiments, the etching process includes performing a dry etch process, a wet etch process, or another suitable etch process.

Figure 24:
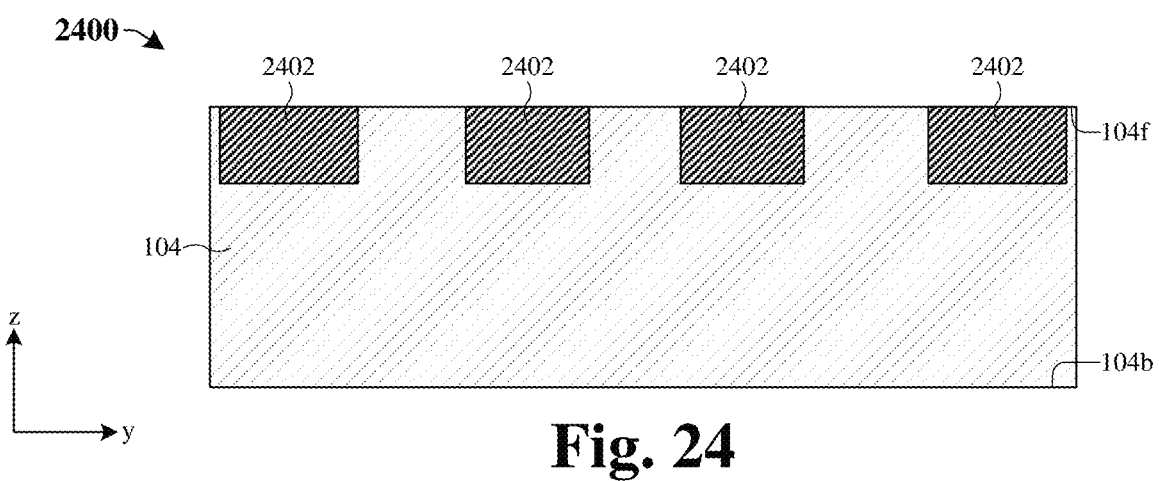

As illustrated by the cross-sectional view 2400 of FIG. 24, a sacrificial layer 2402 is selectively formed within the plurality of openings (2302 of FIG. 23). In various embodiments, the sacrificial layer 2402 may, for example, be formed by epitaxially growing silicon germanium or some other suitable material over the first substrate 104. For example, the sacrificial layer 2402 may be formed by MBE, VPE, LPE, some other epitaxial process, or any combination of the foregoing. In some alternative embodiments, the sacrificial layer 2402 may be deposited rather than grown, and the deposition may, for example, comprise a CVD process, a PVD process, an ALD process, or some other suitable deposition process. In yet further embodiments, a process for forming the sacrificial layer 2402 may include: forming (e.g., by MBE, VPE, LPE, CVD, PVD, ALD, etc.) a sacrificial material (e.g., silicon germanium) over the first substrate 104 such that the sacrificial material fills the openings (2302 of FIG. 23); and performing a planarization process (e.g., a CMP process) into the sacrificial material, thereby defining the sacrificial layer 2402.

Figure 25:
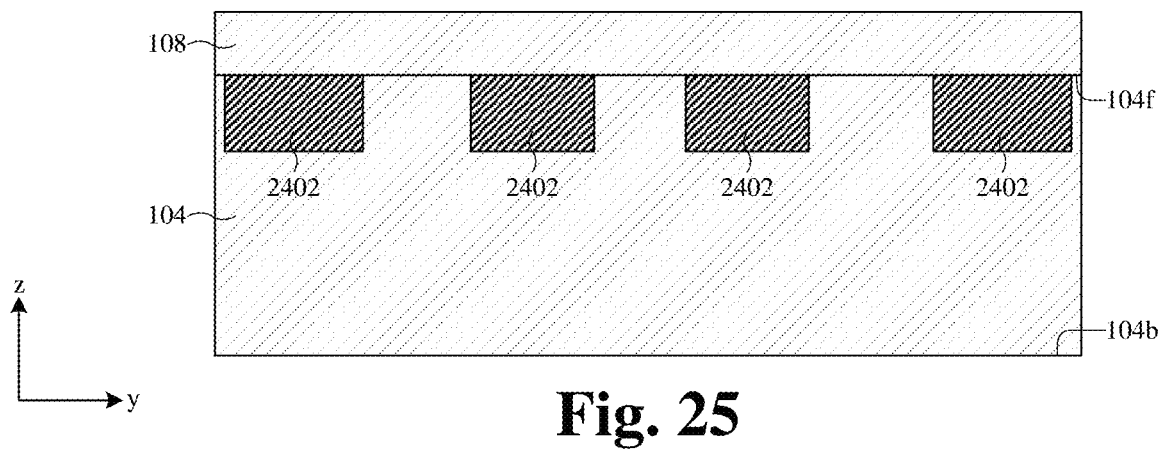

As illustrated by the cross-sectional view 2500 of FIG. 25, a second substrate 108 is formed over the first substrate 104 and the sacrificial layer 2402. In various embodiments, the second substrate 108 may, for example, be formed by epitaxially growing silicon or some other suitable semiconductor material over the second substrate 108. For example, the second substrate 108 may be formed by MBE, VPE, LPE, some other epitaxial process, or any combination of the foregoing. In yet further embodiments, the second substrate 108 may be referred to as a device layer. In yet further embodiments, the second substrate 108 may comprise a same material (e.g., silicon) as the first substrate 104.

Figure 26:
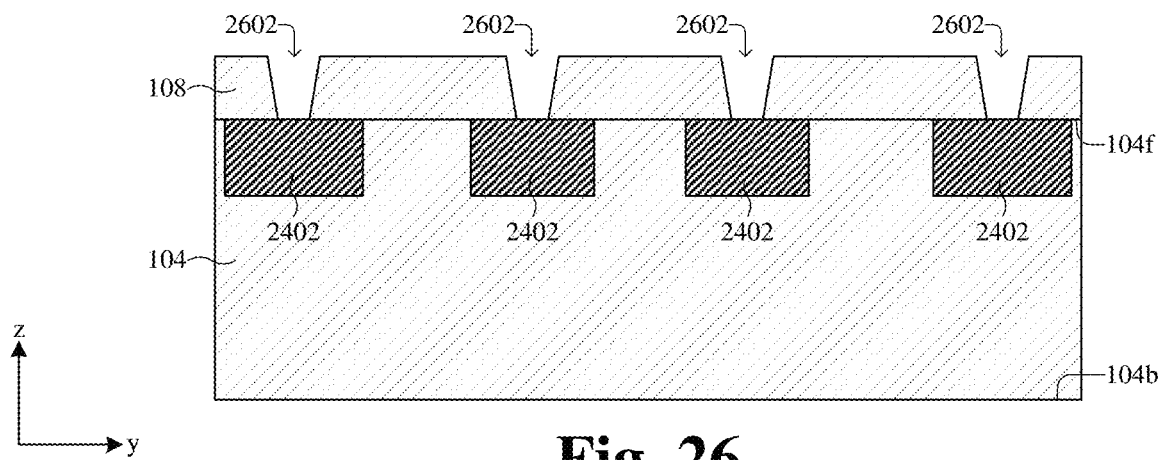

As illustrated by the cross-sectional view 2600 of FIG. 26, a patterning process is performed on the second substrate 108 to form a plurality of openings 2602 in the second substrate 108 and expose an upper surface of the sacrificial layer 2402. In various embodiments, the patterning process includes: forming a masking layer (not shown) over the second substrate 108; performing an etching process (e.g., a dry etching process, a wet etching process, another suitable etching process, or any combination of the foregoing) on the second substrate 108 according to the masking layer, thereby defining the openings 2602; and performing a removal process to remove the masking layer from over the second substrate 108 (not shown).

Figure 27:
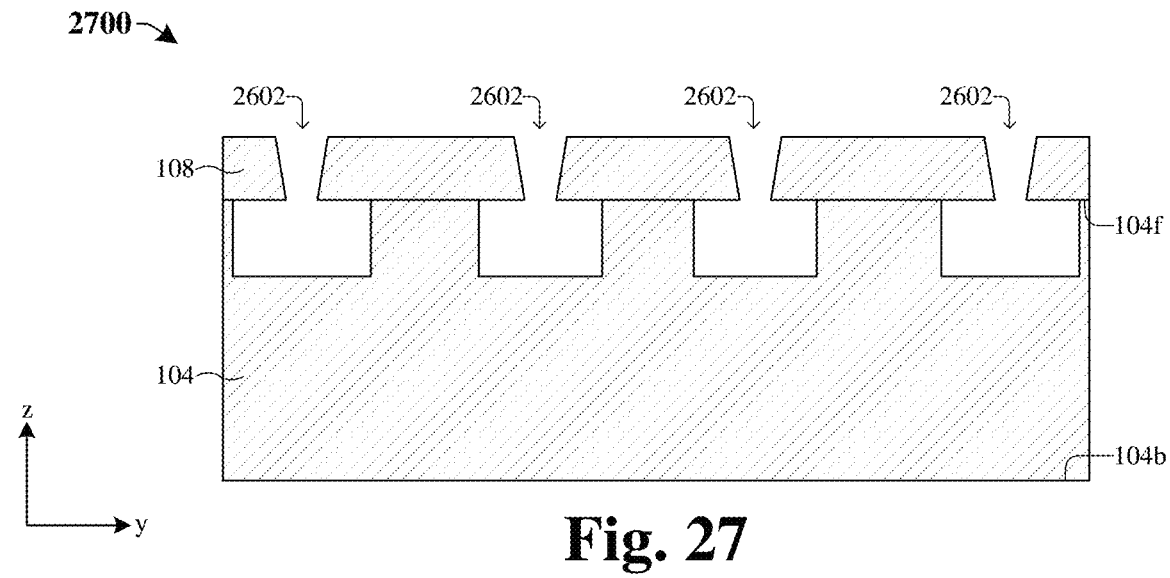

As illustrated by the cross-sectional view 2700 of FIG. 27, a removal process is performed to remove the sacrificial layer (2402 of FIG. 26), thereby expanding the openings 2602. In some embodiments, the removal process may include performing a wet etch process or another suitable removal process.

Figure 28:
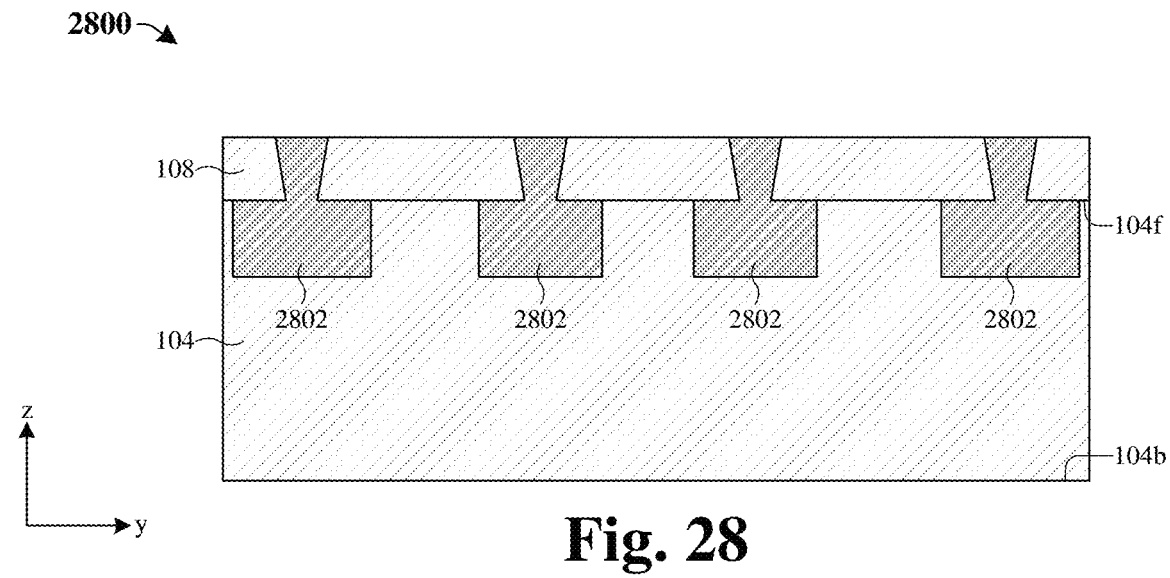

As illustrated by the cross-sectional view 2800 of FIG. 28, a conductive material 2802 is formed over the first substrate 104 such that the conductive material 2802 fills the openings (2602 of FIG. 27). In various embodiments, a process for forming the conductive material 2802 includes: depositing (e.g., by CVD, PVD, sputtering, electroplating, or another suitable growth or deposition process) the conductive material 2802 over the first substrate 104 such that the conductive material 2802 fills the openings (2602 of FIG. 27); and performing a planarization process (e.g., a CMP process) into the conductive material 2802 until an upper surface of the second substrate 108 is reached. In various embodiments, the conductive material 2802 may, for example, be or comprise tungsten, ruthenium, molybdenum, another conductive material, or any combination of the foregoing.

Figure 29:
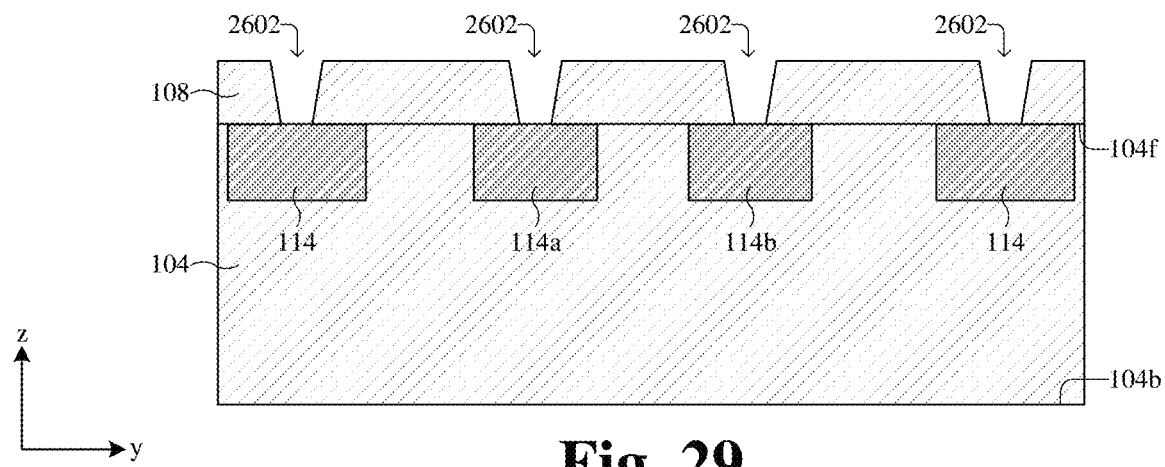

As illustrated by the cross-sectional view 2900 of FIG. 29, an etch back process is performed on the conductive material (2802 of FIG. 28), thereby defining a plurality of power rails 114 within the first substrate 104 and redefining the plurality of openings 2602 in the second substrate 108. In various embodiments, a process for forming the plurality of power rails 114 includes the processing steps illustrated and/or described in FIGS. 23-29. In some embodiments, the etch back process includes performing a dry etching process, a wet etch process, another suitable etch process, or any combination of the foregoing. In various embodiments, the plurality of power rails 114 comprise a first power rail 114a laterally adjacent to a second power rail 114b.

Figure 30:
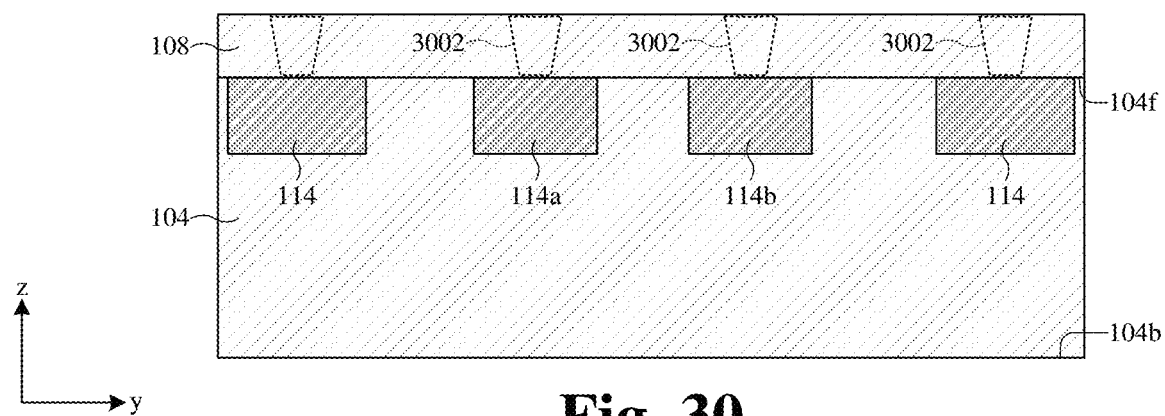

As illustrated by the cross-sectional view 3000 of FIG. 30, a semiconductor material 3002 is formed over the first substrate 104 such that the semiconductor material 3002 fills the plurality of openings (2602 of FIG. 29). In various embodiments, the semiconductor material 3002 may, for example, be formed by epitaxially growing silicon or some other suitable semiconductor material within the plurality of openings (2602 of FIG. 29). For example, the semiconductor material 3002 may be formed by MBE, VPE, LPE, some other epitaxial process, or any combination of the foregoing. In yet further embodiments, the semiconductor material 3002 comprises a same material (e.g., epitaxial silicon) as the second substrate 108 such that the semiconductor material 3002 is part of the second substrate 108. In yet further embodiments, after forming the semiconductor material 3002 over the first substrate 104, a planarization process is performed on the second substrate 108 and the semiconductor material 3002 such that an upper surface of the second substrate 108 is substantially flat.

Figure 31:
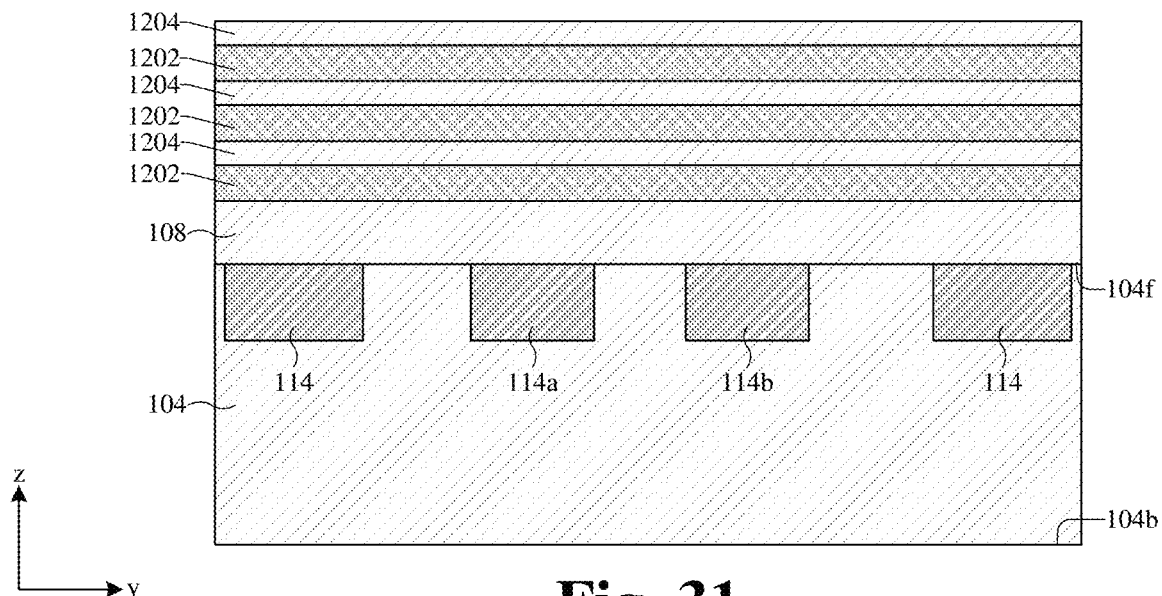

As illustrated by the cross-sectional view 3100 of FIG. 31, a plurality of first semiconductor layers 1202 and a plurality of second semiconductor layers 1204 are alternatingly formed over the second substrate 108. In various embodiments, the plurality of first semiconductor layers 1202 and the plurality of second semiconductor layers 1204 may be formed as illustrated and/or described in FIG. 12.

Figure 32:
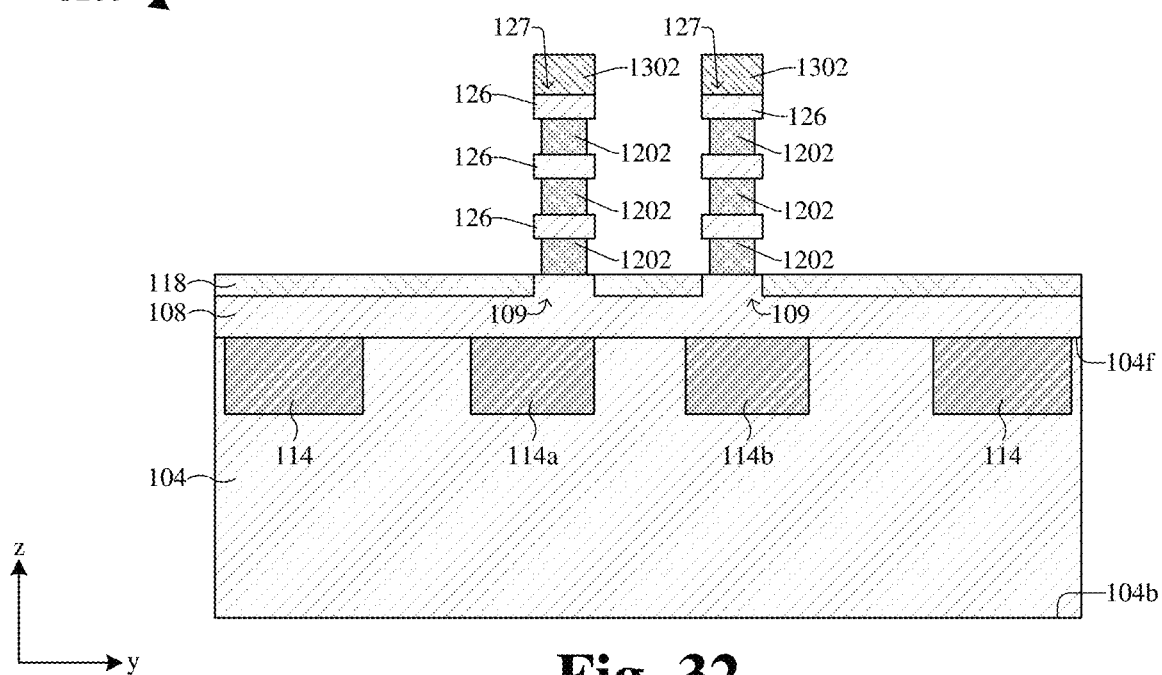

As illustrated by the cross-sectional view 3200 of FIG. 32, a masking layer 1302 is formed over the first semiconductor layers 1202 and the second semiconductor layers (1204 of FIG. 31). Further, a patterning process is performed on the plurality of first semiconductor layers 1202, the plurality of second semiconductor layers (1204 of FIG. 31), and the second substrate 108 according to the masking layer 1302 thereby forming a plurality of fins 109 projecting from the second substrate 108 and nanostructure stacks 127 overlying a corresponding fin 109. In some embodiments, the patterning process includes performing a dry etch process, a wet etch process, another suitable etch process, or any combination of the foregoing. In further embodiments, the nanostructure stacks 127 respectively comprise a plurality of nanostructures 126 directly overlying each fin 109. In further embodiments, an upper insulating structure 118 is formed over the second substrate 108. In some embodiments, a process for forming the upper insulating structure 118 includes depositing the upper insulating structure 118 over the second substrate 108 by a CVD process, a PVD process, an ALD process, or another suitable deposition process.

Figure 33:
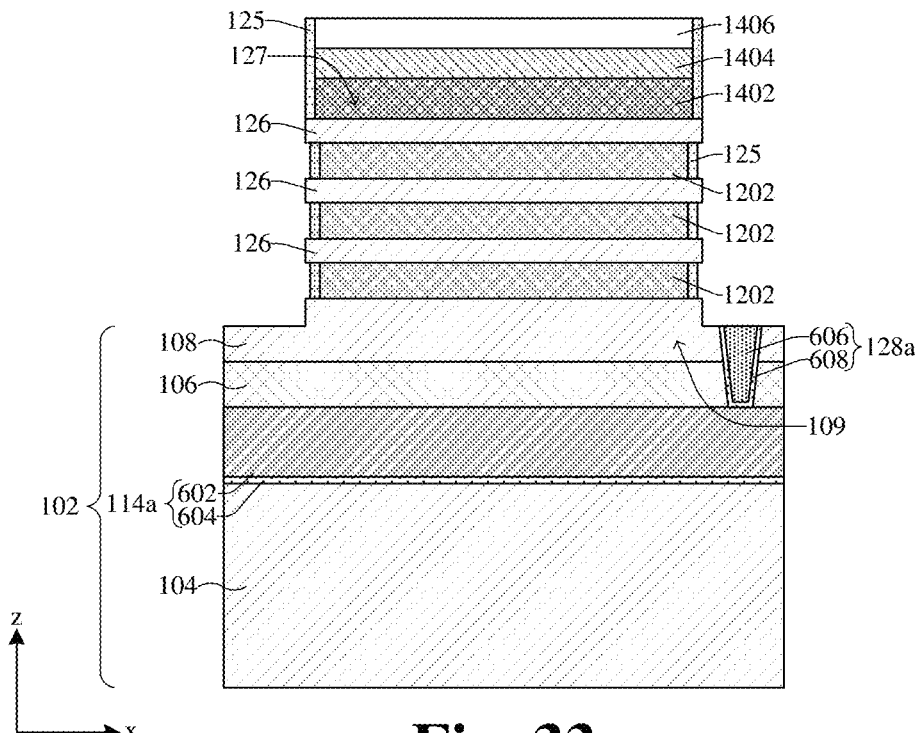
FIGS. 33-35 illustrate cross-sectional views of some additional alternative embodiments of the method of FIGS. 9-21.
Figure 34:
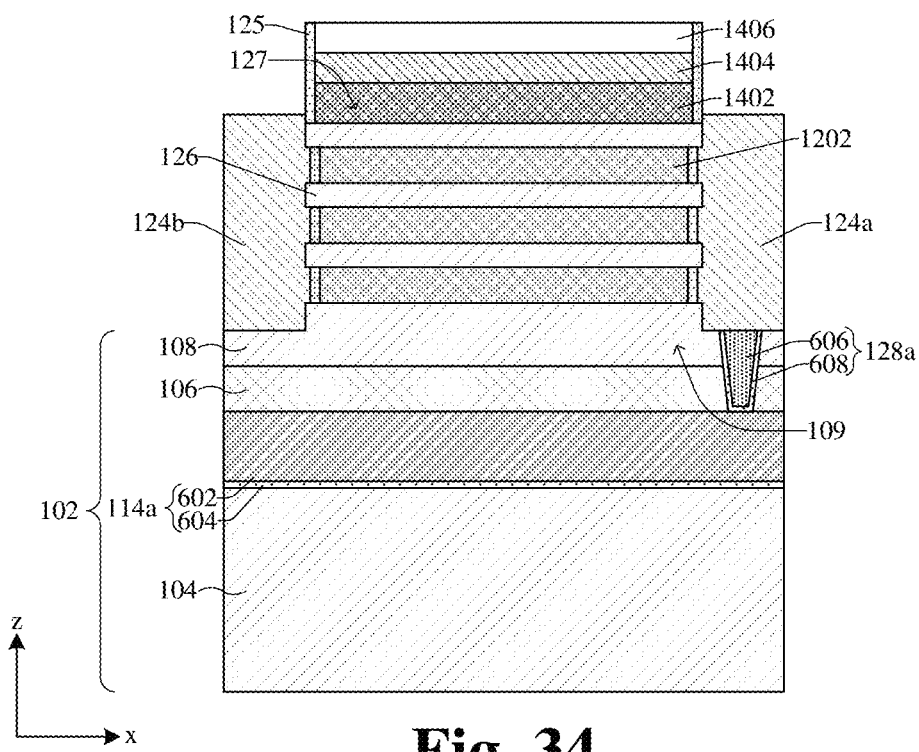
Figure 35:
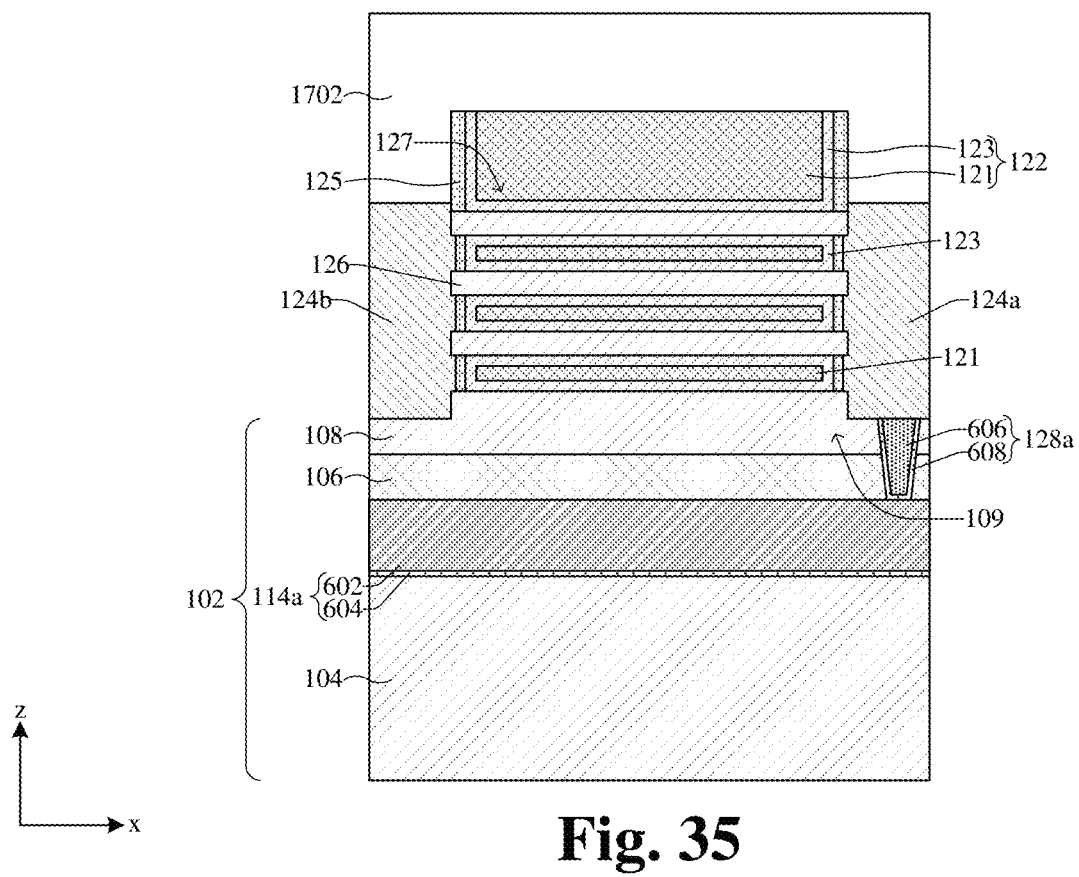

FIGS. 33-35 illustrate cross-sectional views 3300-3500 of some embodiments of a third method for forming an IC having a plurality of power rails embedded in a first substrate and a plurality of source/drain contacts continuously extending from the buried power rails to a plurality of FETs. For example, FIGS. 33-35 illustrate alternative embodiments of acts that may be performed in the place of the acts at FIGS. 14A-14B through 17A-17C of the method of FIGS. 9-21. Thus, in some embodiments, the third method includes a method that alternatingly proceeds from FIGS. 9-13B to FIGS. 33-35, and then from FIG. 35 to FIGS. 18A-18D through 21 (i.e., skipping FIGS. 14A-14B through 17A-17C).

As illustrated by the cross-sectional view 3300 of FIG. 33, a first source/drain contact 128a is formed within the second substrate 108 and the lower insulating structure 106 such that the first source/drain contact 128a directly overlies the first power rail 114a. In some embodiments, the first source/drain contact 128a comprises a second conductive liner 608 and a second conductive body 606. In various embodiments, a process for forming the first source/drain contact 128a includes: forming a masking layer (not shown) over the second substrate 108; patterning the second substrate 108 and the lower insulating structure 106 according to the masking layer, thereby defining a contact opening above the first power rail 114a; depositing (e.g., by CVD, PVD, electroplating, sputtering, or another suitable growth or deposition process) the second conductive liner 608 over the second substrate 108 such that the second conductive liner 608 lines the contact opening; and depositing (e.g., by CVD, PVD, electroplating, sputtering, or another suitable growth or deposition process) the second conductive body 606 over the second conductive liner 608 such that the second conductive body 606 fills the contact opening, thereby defining the first source/drain contact 128a. In various embodiments, an etch back process may be performed on the second conductive liner 608 and/or the second conductive body 606 after depositing the second conductive body 606. In yet further embodiments, a second source/drain contact (not shown) may be formed over the second power rail (114b of FIG. 12) by the same process for forming the first source/drain contact 128a as illustrated and/or described above (not shown).

Further, as illustrated in FIG. 33, a dummy gate structure 1402, a hard mask 1404, and a dielectric structure 1406 are formed over the second substrate 108. In further embodiments, inner spacers 125 are formed along sidewalls of the first semiconductor layers 1202, sidewalls of the dummy gate structure 1402, sidewalls of the hard mask 1404, and sidewalls of the dielectric structure 1406. In various embodiments, the dummy gate structure 1402, the hard mask 1404, the dielectric structure 1406, and/or the inner spacers 125 may be formed before forming the first source/drain contact 128a.

As illustrated by the cross-sectional view 3400 of FIG. 34, a pair of source/drain structures 124a-b is formed on opposing sides of the plurality of nanostructures 126. The pair of source/drain structures 124a-b comprises a first source/drain structure 124a and a second source/drain structure 124b. In various embodiments, the pair of source/drain structures 124a-b may be formed as illustrated and/or described in FIGS. 14A-14B. In yet further embodiments, the first source/drain structure 124a directly overlies the first source/drain contact 128a.

As illustrated by the cross-sectional view 3500 of FIG. 35, a gate structure 122 is formed over and/or around the plurality of nanostructures 126. The gate structure 122 comprises a gate electrode 121 and a gate dielectric layer 123 disposed between the nanostructures 126 and the gate electrode 121. In various embodiments, the gate structure 122 is formed as illustrated and/or described in FIGS. 15A-15B. Further, a first dielectric structure 1702 is formed over the gate structure 122.

Thus, the present disclosure relates to an IC comprising a plurality of buried power rails directly underlying a plurality of field-effect transistors (FETs), and a plurality of source/drain contacts continuously extending from a source/drain structure of each FET to the buried power rails.

Accordingly, in some embodiments, the present disclosure relates to a semiconductor device, comprising: a gate structure overlying a front-side surface of a first substrate, wherein the first substrate has a back-side surface opposite the front-side surface; a first source/drain structure overlying the first substrate and laterally adjacent to the gate structure; a power rail embedded in the first substrate and directly underlying the first source/drain structure; and a first source/drain contact continuously extending from the first source/drain structure to the power rail, wherein the first source/drain contact electrically couples the first source/drain structure to the power rail.

In other embodiments, the present disclosure relates to an integrated chip, comprising: a first substrate having a front-side surface opposite a back-side surface; a first field-effect transistors (FET) overlying the front-side surface of the first substrate; a second FET overlying the front-side surface of the first substrate and laterally adjacent to the first FET, wherein the first and second FETs respectively comprise a first source/drain structure and a second source/drain structure disposed on opposing sides of a gate electrode; a plurality of power rails disposed within the first substrate, wherein the plurality of power rails comprises a first power rail directly underlying the first source/drain structure of the first FET and a second power rail directly underlying the first source/drain structure of the second FET; a first interconnect structure overlying the front-side surface of the first substrate; a second interconnect structure disposed along the back-side surface of the first substrate; a plurality of through-substrate vias (TSVs) continuously extending from the second interconnect structure to the plurality of power rails; a first source/drain contact disposed between the first power rail and the first source/drain structure of the first FET; and a second source/drain contact disposed between the second power rail and the second source/drain structure of the second FET, wherein the first and second source/drain contacts are configured to electrically couple the first and second FETs to the second interconnect structure by way of the plurality of power rails and the TSVs.

In yet other embodiments, the present disclosure relates to a method for forming an integrated chip, the method comprising: forming a power rail within a front-side surface of a first substrate; forming a gate structure over the front-side surface of the first substrate; forming a pair of source/drain structures on opposing sides of the gate structure such that the pair of source/drain structures overlie the power rail, wherein the pair of source/drain structures comprises a first source/drain structure and a second source/drain structure; and forming a source/drain contact over the power rail such that the source/drain contact continuously extends from the first source/drain structure to the power rail.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a gate structure overlying a front-side surface of a first substrate, wherein the first substrate has a back-side surface opposite the front-side surface;
   a first source/drain structure overlying the first substrate and laterally adjacent to the gate structure;
   a power rail embedded in the first substrate and directly underlying the first source/drain structure; and
   a first source/drain contact continuously extending from the first source/drain structure to the power rail, wherein the first source/drain contact electrically couples the first source/drain structure to the power rail, wherein outer sidewalls of the first source/drain contact directly contact inner sidewalls of the first source/drain structure.

2. The semiconductor device of claim 1, wherein a width of the first source/drain structure is greater than a width of the first source/drain contact.

3. The semiconductor device of claim 1, wherein a top surface of the first source/drain contact is coplanar with a top surface of the first source/drain structure.

4. The semiconductor device of claim 1, further comprising:
   a lower insulating structure disposed between the first substrate and the first source/drain structure, wherein the first source/drain contact continuously extends through the lower insulating structure to a top surface of the power rail.

5. The semiconductor device of claim 1, wherein a top surface of the power rail is coplanar with the front-side surface of the first substrate.

6. The semiconductor device of claim 1, further comprising:
   a second substrate overlying the front-side surface of the first substrate; and
   a fin projecting vertically from the second substrate, wherein the gate structure directly overlies the fin, and wherein the first source/drain contact continuously vertically extends from above a top surface of the fin to a point below a bottom surface of the fin.

7. The semiconductor device of claim 1, further comprising:
   a second source/drain structure laterally adjacent to the gate structure and directly overlying the power rail, wherein the first and second source/drain structures are disposed on opposing sides of the gate structure.

8. The semiconductor device of claim 7, further comprising:
   a first interconnect structure overlying the front-side surface of the first substrate, wherein the first interconnect structure comprises a plurality of conductive vias disposed within an interconnect dielectric structure, wherein a first conductive via in the plurality of conductive vias directly contacts the second source/drain structure, and wherein the interconnect dielectric structure continuously extends along a top surface of the first source/drain structure.

9. The semiconductor device of claim 1, wherein the power rail comprises a conductive body and a conductive liner, wherein the conductive liner continuously extends from a bottom surface of the conductive body to opposing sidewalls of the conductive body.

10. The semiconductor device of claim 1, wherein a top surface of the first source/drain contact is disposed below a top surface of the gate structure.

11. An integrated chip, comprising:
- a first substrate having a front-side surface opposite a back-side surface;
- a first field-effect transistor (FET) overlying the front-side surface of the first substrate;
- a second FET overlying the front-side surface of the first substrate and laterally adjacent to the first FET, wherein the first and second FETs respectively comprise a first source/drain structure and a second source/drain structure disposed on opposing sides of a gate electrode;
- a plurality of power rails disposed within the first substrate, wherein the plurality of power rails comprises a first power rail directly underlying the first source/drain structure of the first FET and a second power rail directly underlying the first source/drain structure of the second FET;
- a first interconnect structure overlying the front-side surface of the first substrate;
- a second interconnect structure disposed along the back-side surface of the first substrate;
- a plurality of through-substrate vias (TSVs) continuously extending from the second interconnect structure to the plurality of power rails;
- a first source/drain contact disposed between the first power rail and the first source/drain structure of the first FET; and
- a second source/drain contact disposed between the second power rail and the second source/drain structure of the second FET, wherein the first and second source/drain contacts are configured to electrically couple the first and second FETs to the second interconnect structure by way of the plurality of power rails and the TSVs.

12. The integrated chip of claim 11, wherein the first source/drain contact continuously extends from a top surface of the first power rail to an outer sidewall of the first power rail.

13. The integrated chip of claim 11, wherein the first FET comprises a plurality of nanostructures extending through the gate electrode, wherein the first source/drain contact continuously vertically extends from above a top surface of the plurality of nanostructures to below a bottom surface of the plurality of nanostructures.

14. The integrated chip of claim 11, wherein a width of the first source/drain contact continuously decreases from a top surface of the first source/drain contact in a direction towards the first power rail.

15. The integrated chip of claim 11, wherein the first FET is configured as a n-channel gate-all-around FET (GAAFET) and the second FET is configured as a p-channel GAAFET.

16. The integrated chip of claim 11, wherein the first FET comprises a fin extending through the gate electrode, wherein a width of the first source/drain contact is greater than a width of the fin.

17. The integrated chip of claim 11, wherein a top surface of the first source/drain contact is disposed along a bottom surface of the first source/drain structure, wherein a bottom surface of the first source/drain contact is disposed along a top surface of the first power rail.

18. A method for forming an integrated chip, the method comprising:
- forming a power rail within a front-side surface of a first substrate;
- forming a gate structure over the front-side surface of the first substrate;
- forming a pair of source/drain structures on opposing sides of the gate structure such that the pair of source/drain structures overlies the power rail, wherein the pair of source/drain structures comprises a first source/drain structure and a second source/drain structure;
- forming a source/drain contact over the power rail such that the source/drain contact continuously extends from the first source/drain structure to the power rail, wherein forming the source/drain contact comprises:
  - patterning the first source/drain structure to form a contact opening over the power rail such that a top surface of the power rail is exposed;
  - depositing a first conductive liner over the first substrate such that the first conductive liner lines the contact opening; and
  - depositing a first conductive body over the first conductive liner and within the contact opening.

19. The method of claim 18, wherein forming the power rail comprises:
- patterning the front-side surface of the first substrate to define an opening within the first substrate;
- depositing a second conductive liner over the first substrate such that the second first conductive liner lines the opening;
- depositing a second conductive body over the second conductive liner and within the opening; and
- performing a planarization process into the second conductive liner and the second conductive body.

20. The method of claim 18, further comprising:
- forming a first interconnect structure over the front-side surface of the first substrate, wherein the first interconnect structure comprises a plurality of conductive vias and conductive wires disposed within a dielectric structure, wherein a bottommost surface of the plurality of conductive vias is vertically above a bottom surface of the source/drain contact.

* * * * *